United States Patent
Lee et al.

(10) Patent No.: US 6,881,999 B2
(45) Date of Patent: Apr. 19, 2005

(54) SEMICONDUCTOR DEVICE WITH ANALOG CAPACITOR AND METHOD OF FABRICATING THE SAME

(75) Inventors: Ki-Young Lee, Kyunggi-do (KR); Sang-Hoon Park, Suwon-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/393,093

(22) Filed: Mar. 20, 2003

(65) Prior Publication Data

US 2003/0178666 A1 Sep. 25, 2003

(30) Foreign Application Priority Data

Mar. 21, 2002 (KR) ............................... 10-2002-0015276
Jan. 13, 2003 (KR) ............................... 10-2003-0002113

(51) Int. Cl.[7] ........................................ H01L 21/8242
(52) U.S. Cl. ..................... 257/306; 257/305; 257/307; 257/310; 257/311; 257/309; 257/312; 438/253; 438/252; 438/251
(58) Field of Search ................................ 257/305, 306, 257/307, 310, 311; 438/253, 252, 251

(56) References Cited

U.S. PATENT DOCUMENTS 6,025,226 A 2/2000 Gambino et al. ............ 438/244
6,081,021 A 6/2000 Gambino et al. ............ 257/530
6,261,917 B1 * 7/2001 Quek et al. .................. 438/398
6,483,142 B1 * 11/2002 Hsue et al. .................. 257/306

FOREIGN PATENT DOCUMENTS

JP 01-203329 7/2001 ............ H01L/27/04
KR 02-30421 4/2002 ......... H01L/27/108

* cited by examiner

*Primary Examiner*—Nathan J. Flynn
*Assistant Examiner*—Fazli Erdem
(74) *Attorney, Agent, or Firm*—Mills & Onello LLP

(57) ABSTRACT

A semiconductor device having an analog capacitor and a method of fabricating the same are disclosed. The semiconductor device includes a bottom plate electrode disposed at a predetermined region of a semiconductor substrate, and an upper plate electrode having a region overlapped with the bottom plate electrode thereon. The upper plate electrode and the bottom plate electrode are formed of a metal compound. A capacitor dielectric layer is interposed between the bottom plate electrode and the upper plate electrode. A bottom electrode plug and an upper electrode plug are connected to the bottom plate electrode and the upper plate electrode through the interlayer dielectric layer.

23 Claims, 29 Drawing Sheets

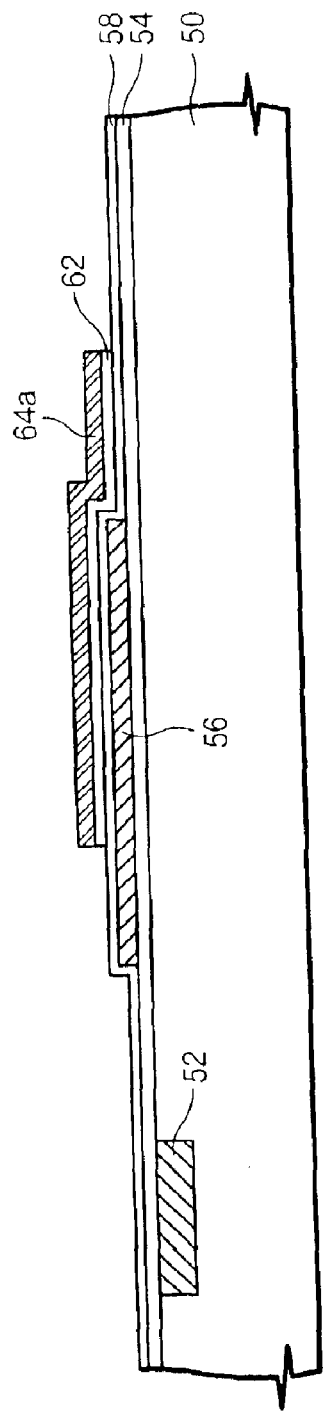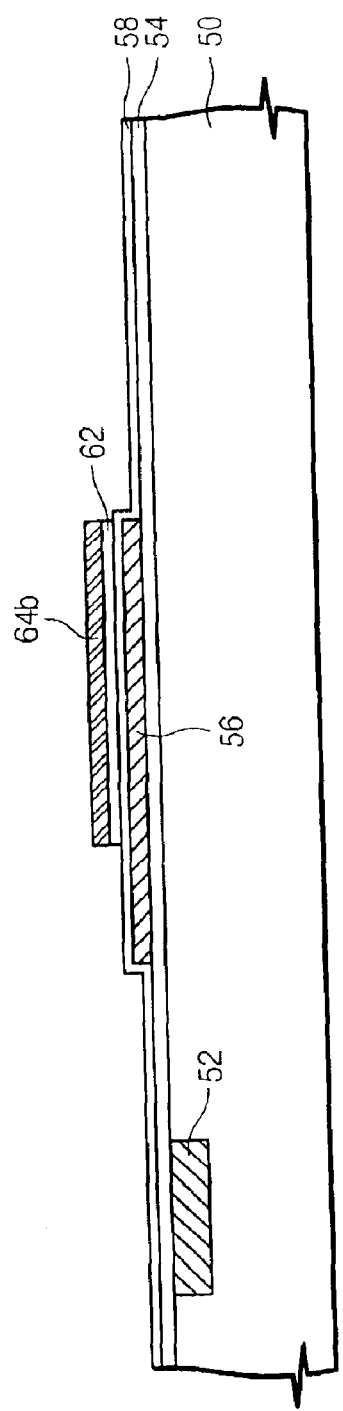

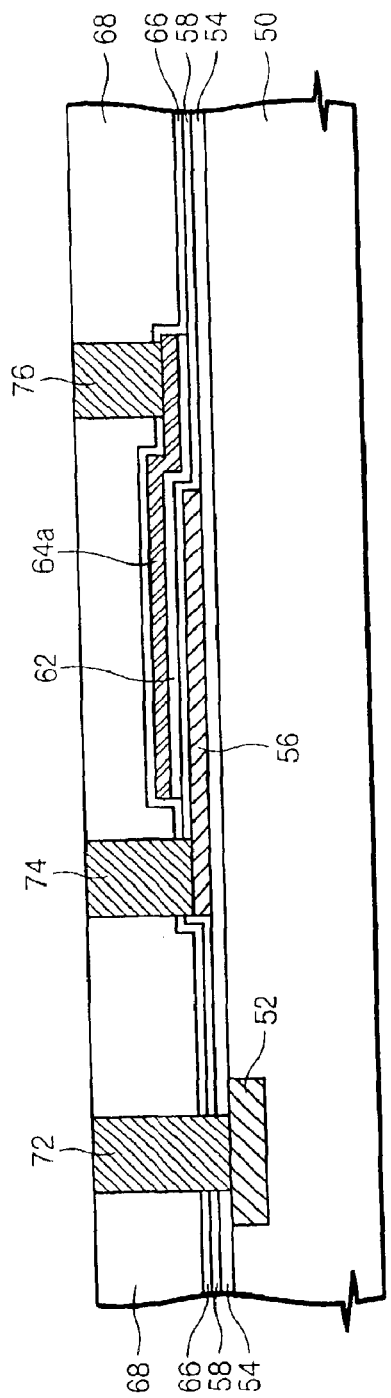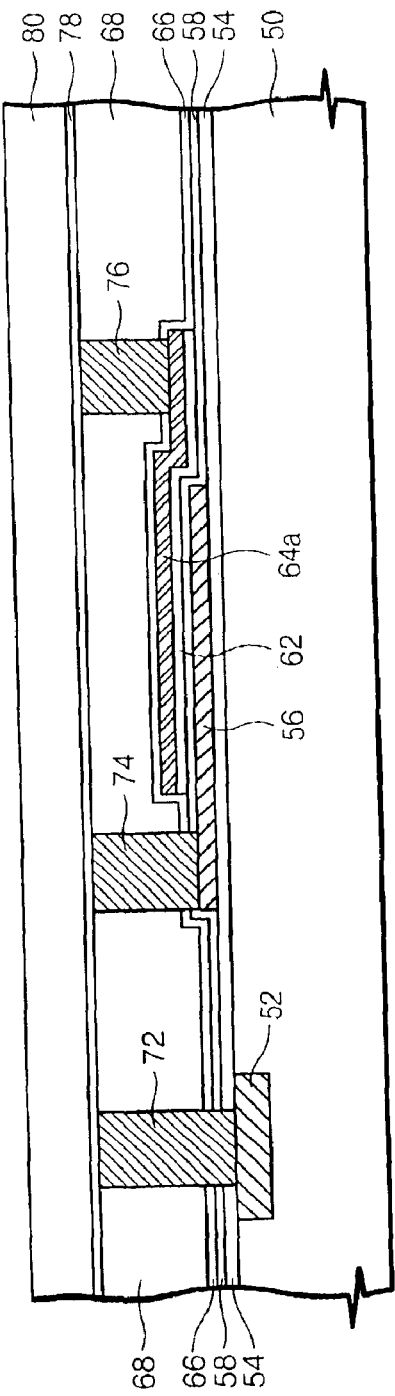

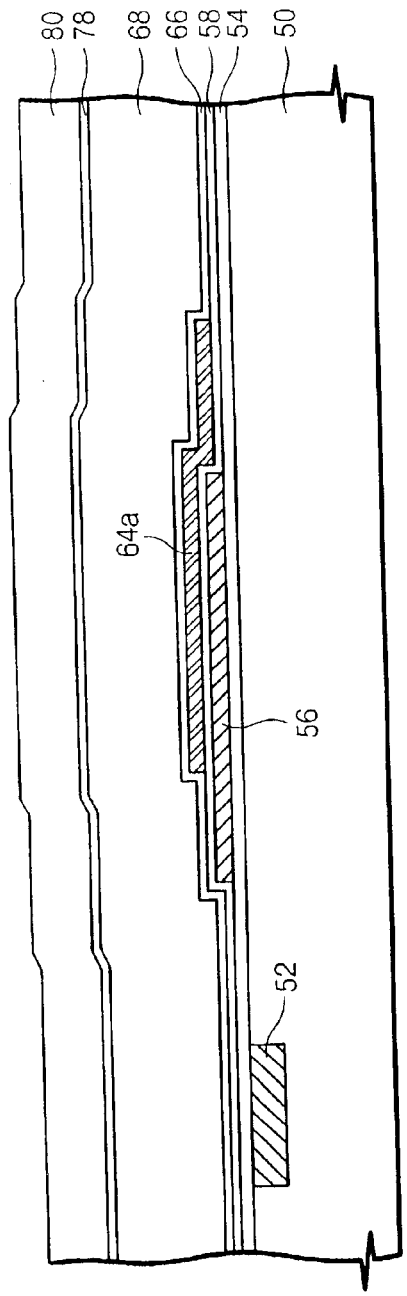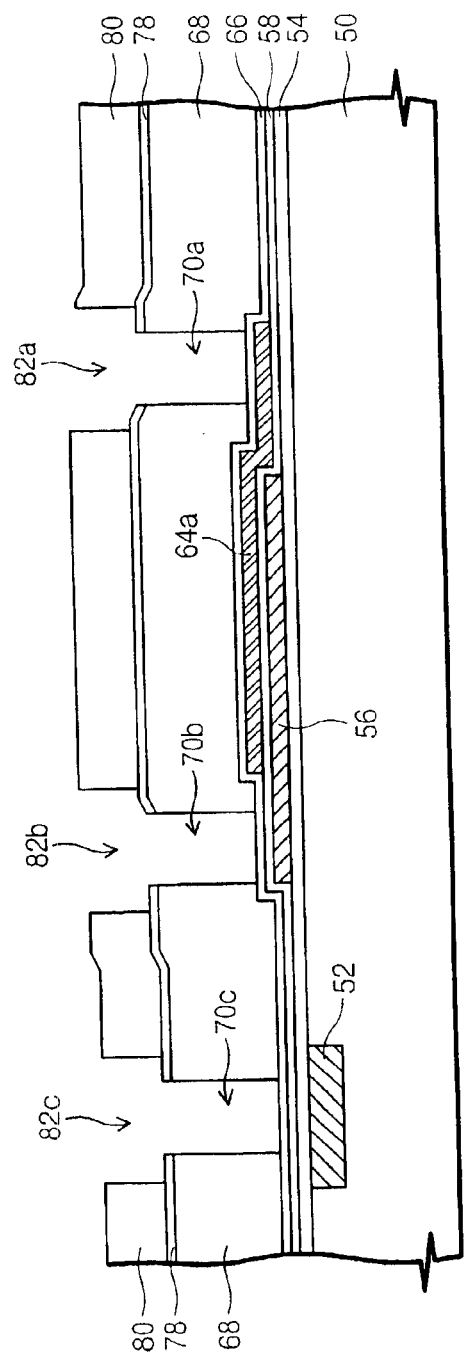

SEMICONDUCTOR DEVICE WITH ANALOG CAPACITOR AND METHOD OF FABRICATING THE SAME

FIELD OF THE INVENTION

The present invention relates to a semiconductor device and a method of forming the same. More particularly, the present invention relates to a semiconductor device having an analog capacitor of a metal-insulator-metal (MIM) structure and a method of forming the same.

BACKGROUND OF THE INVENTION

A recently introduced merged memory logic (MML) is a device in which a memory cell array part such as a dynamic random access memory (DRAM) and an analog or a peripheral circuit are integrated in one chip. The introduction of the MML results in improving multimedia functions and effectively approaching high integration and speed in semiconductor devices. However, in an analog circuit which is required for high speed, it is regarded as of major importance to develop a semiconductor device having capacitors of large quantity. Generally, in the case that the capacitor has a polysilicon/insulator/polysilicon (PIP) structure, since upper and lower electrodes are formed of polysilicon, oxidation occurs at an interface between the dielectric layer and the upper/lower electrodes, and an oxide layer is formed at the interface. This results in decreasing the total capacitance. Also, a depletion layer formed at the polysilicon layer decreases the capacitance. Thus, the PIP structure is not proper for a device required for high speed and frequency. In order to solve this problem, the structure of the capacitor has been changed to a metal/insulator/silicon (MIS) structure or MIM structure. Having low resistance and no parasitic capacitance due to depletion, the MIM-type capacitor is usually used for high-performance semiconductor devices. Recently, with low resistance, copper is introduced for metal interconnections in the semiconductor device. Also, various capacitors having MIM structures with Cu electrodes are suggested. A capacitor with the MIM structure and a method of forming the same are disclosed in the U.S. Pat. No. 6,025,226 entitled: "Method of forming a capacitor and a capacitor formed using the method" by Gambino et al. A method of simultaneously forming interconnects and capacitors is disclosed in the U.S. Pat. No. 6,081,021 entitled: "Conductor-Insulator-Conductor structure."

FIGS. 1 through 4 illustrate process cross-sectional views showing a method of a conventional semiconductor device with a capacitor of the MIM structure.

Referring to FIG. 1, an interconnection layer 15 and a lower electrode 10 are formed at a desired region of a semiconductor substrate 5. Conventionally, the interconnection layer 15 and the lower electrode 10 are formed on an insulation layer using a damascene process. An interlayer dielectric layer 7 is formed at the entire surface of the semiconductor substrate 5 having the interconnection layer 15 and the lower electrode 10. The interlayer dielectric layer 7 is patterned to form first and second openings 30 and 20 exposing desired regions of the interconnection layer 15 and the lower electrode 10, respectively. A dielectric layer 22 is conformally formed at the entire surface of the interlayer dielectric layer 7. The dielectric layer 22 covers the inner walls of the first and second openings 30 and 20, and the interconnection layer 15 and the lower electrode 10 which are exposed in the first and second openings 30 and 20, respectively.

Referring to FIG. 2, the upper part of the interlayer dielectric layer 7 is etched to form a trench 32 at the upper part thereof. The trench 32 is formed using a photo lithography process. At this time, the dielectric layer 22 in the first opening 30 is anisotropically etched to expose the interconnection layer 15 therein.

Referring to FIG. 3, the first opening 30, the trench 32, and the second opening 20 are filled with a metal layer to form an interconnection plug 26 connected to the interconnection layer 15 and an upper electrode 24 in the second opening 20. Conventionally, the interconnection plug 25 and the upper electrode 24 can be formed by polishing the metal layer filling the first opening 30, the second opening 20 and the trench 32, by a CMP process. At this time, according to the conventional technology, a native oxide layer can be formed at an exposed surface of the interconnection layer 15 in the first opening 30 during the delay time between forming the first opening 30 and filling it with the metal layer. The native oxide layer on the surface of the interconnection layer 15 increases parasitic resistance and parasitic capacitance to result in decreasing properties of the semiconductor device which is required for high speed and superior frequency. Thus, in order to decrease the contact resistance between the interconnection layer 15 and the interconnection plug 26, an etch process for removing the native oxide is required before filling with the metal layer. During this etch process, the dielectric layer 22 in the second opening 20 can be exposed and damaged.

A mold layer 9 is formed at the entire surface of the semiconductor substrate at which the interconnect 26 and the upper electrode 24 are formed. The mold layer 9 is patterned to form third openings 40 exposing the upper electrode 24 and a desired region of the interconnection plug 26.

Referring to FIG. 4, a metal interconnection 42 is formed to fill in the third openings 40 and to selectively contact to the interconnection plug 26 and the upper electrode 24. The lower electrode 10, the upper electrode 24, and the dielectric layer interposed therebetween compose a capacitor of a semiconductor device.

According the described conventional technology, since the upper electrode 24 has a vertical structure, the area of dielectric layer 22 interposed between the interlayer dielectric layer 7 and the upper electrode 24 is so large as to increase the parasitic capacitance.

SUMMARY OF THE INVENTION

It is a feature of the present invention to provide a semiconductor device with a capacitor using metal electrodes and a method of forming the same.

It is another feature of the present invention to provide a semiconductor device with improved properties at high speed and frequency and a method of forming the same.

The present invention is directed to a semiconductor device having a capacitor of an MIM structure. In one aspect, the semiconductor device of the invention comprises a bottom plate electrode arranged at a predetermined region of a semiconductor substrate and an upper plate electrode overlapped with a portion of the bottom plate electrode. The upper plate electrode and the bottom plate electrode are formed of metal compounds. A capacitor dielectric layer is interposed between the bottom plate electrode and the upper plate electrode, and an interlayer dielectric layer is formaed on the upper plate electrode and the bottom plate electrode. A bottom electrode plug and an upper electrode plug are connected to the bottom plate electrode and the upper plate electrode, respectively, through the interlayer dielectric layer.

The present invention is also directed to a method of forming a semiconductor device having a capacitor of an MIM structure. The method comprises forming a bottom plate electrode at a predetermined region of a semiconductor substrate, an upper plate electrode overlapped with a portion of the bottom plate electrode, and a capacitor dielectric layer interposed between the bottom plate electrode and the upper plate electrode. An interlayer dielectric layer is formed on the bottom electrode and the upper plate electrode. A bottom electrode plug and an upper electrode plug are formed to connect to the bottom plate electrode and the upper plate electrode, respectively, through the interlayer dielectric layer. The bottom plate electrode and the upper plate electrode are formed of metal compounds.

According to another aspect of the present invention, a bottom plate electrode is formed at a predetermined region of a semiconductor substrate. An upper plate electrode is formed to be overlapped with the bottom plate electrode, and a capacitor dielectric layer is formed to be interposed between the bottom plate electrode and the upper plate electrode. An interlayer dielectric layer and a mold layer are sequentially formed on an entire surface of the semiconductor substrate where the upper plate electrode is formed. A first metal interconnection and a second metal interconnection are formed in the mold layer to cross over the interlayer dielectric layer, and to be extended through the interlayer dielectric layer to the upper plate electrode and the bottom plate electrode, respectively. The bottom plate electrode and the upper plate electrode are formed of a metal compound.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

FIGS. 6 through 17 illustrate process cross-sectional views illustrating a method of forming a semiconductor device having the capacitor of the MIM structure according to the first embodiment of the present invention.

FIGS. 31 through 34 illustrate process cross-sectional views illustrating a method of forming a semiconductor device having the capacitor of the MIM structure according to the fifth embodiment of the present invention.

DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be construed as limited to the embodiments set forth herein.

Embodiment 1

Figure 1:
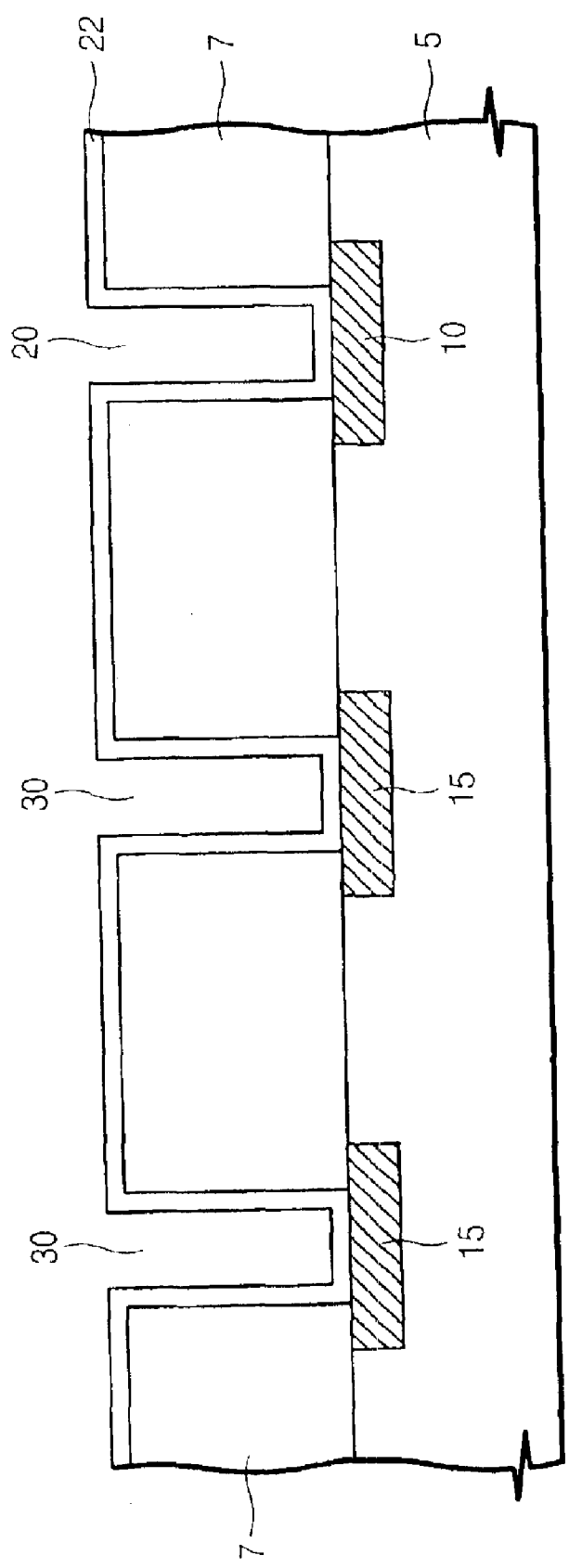
FIGS. 1 through 4 illustrate process cross-sectional views illustrating a method of forming a conventional semiconductor device having a capacitor with an MIM structure.
Figure 2:
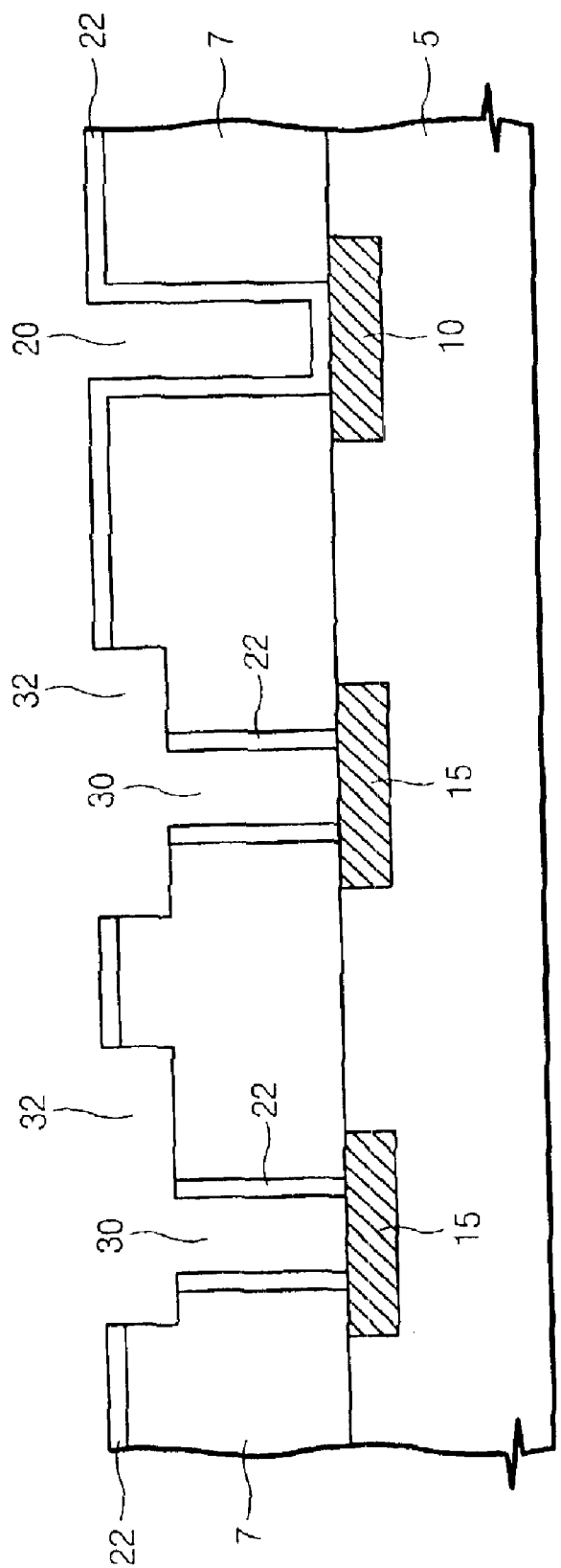
Figure 3:
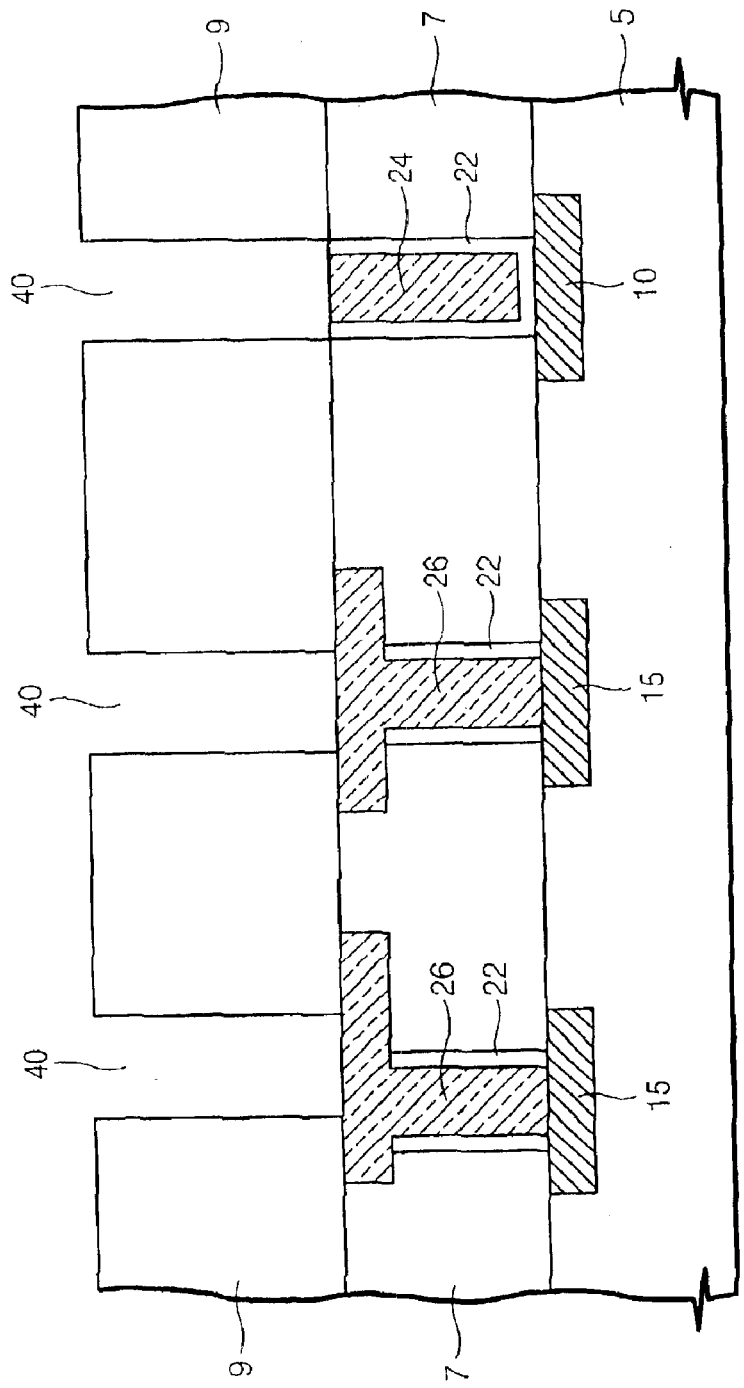
Figure 4:
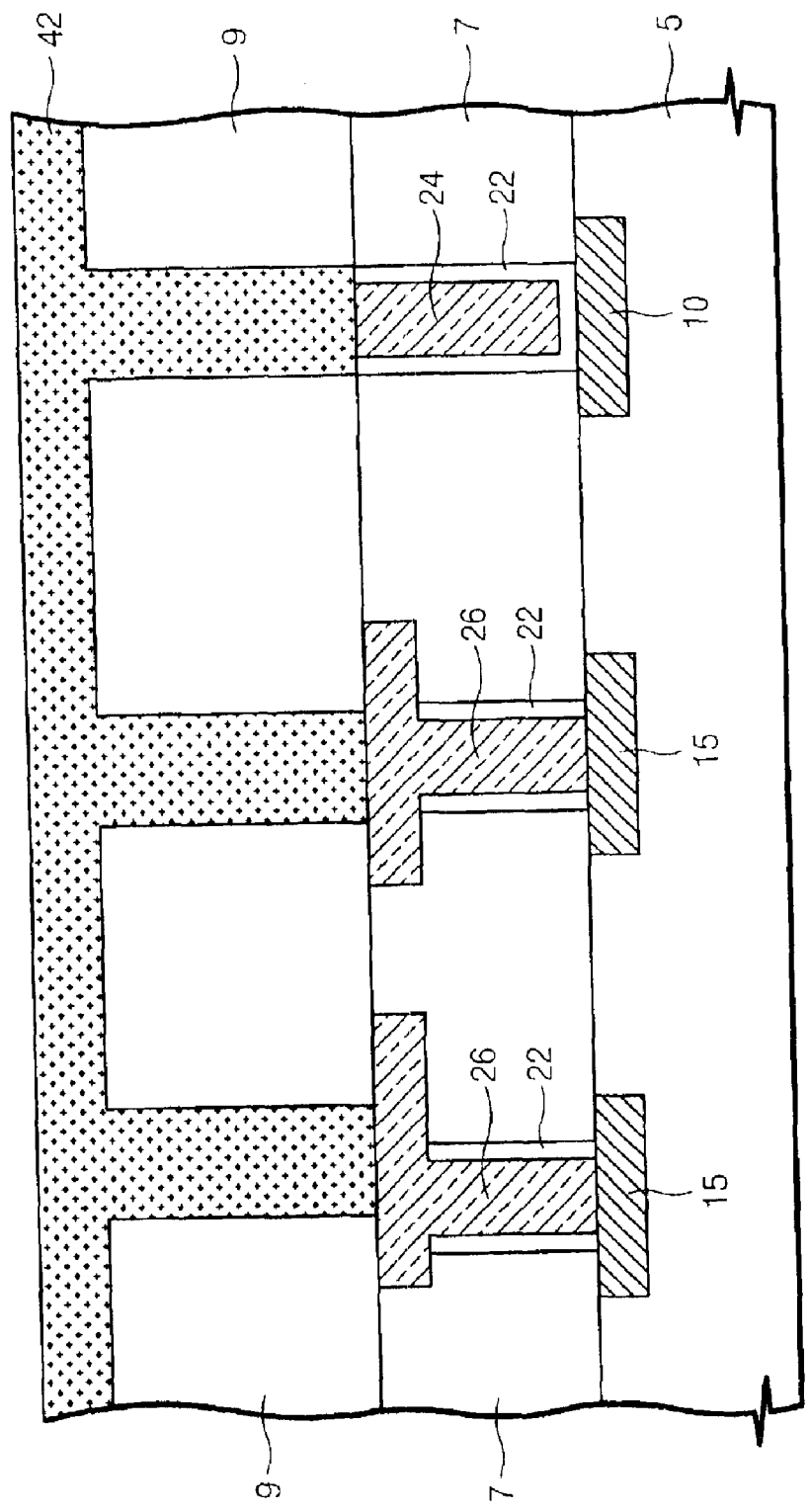
Figure 5:
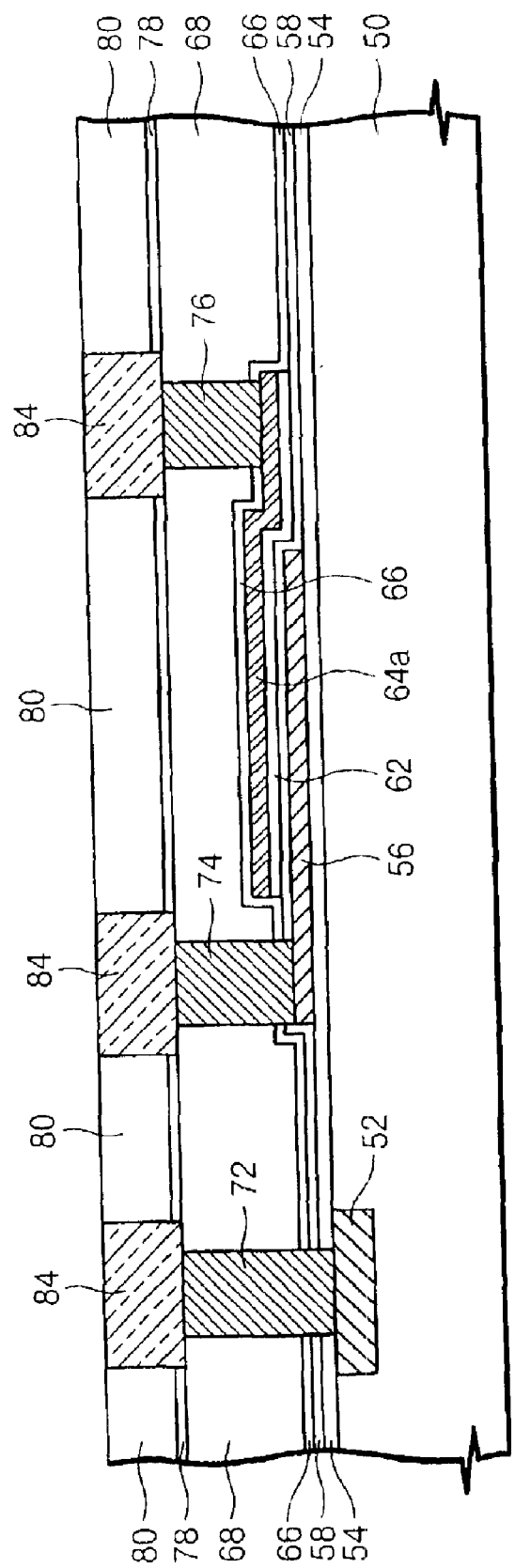
FIG. 5 illustrates a cross-sectional view illustrating a semiconductor device having a capacitor of an MIM structure according to a first embodiment of the present invention.

FIG. 5 illustrates a cross-sectional view of showing a semiconductor device having a capacitor of an MIM structure according to a first embodiment of the present invention.

Referring to FIG. 5, the present invention comprises a bottom plate electrode 56, and an upper plate electrode 64a overlapped with a portion of the bottom plate electrode. The bottom plate electrode 56 and the upper plate electrode 64a are formed of metal compounds. For example, the bottom plate electrode 56 and the upper plate electrode 64a are formed of a material selected from a group comprising titanium nitride (TiN), tantalum nitride (TaN), and titanium tungsten (TiW). The bottom plate electrode 56 and the upper plate electrode 64a have a relatively thin thickness of 2001~1000 Å. The bottom plate electrode is arranged at a predetermined region of a semiconductor substrate 50. The semiconductor substrate 50 is preferably a silicon substrate which is covered by an insulation layer or not covered. Also, an interconnection layer 52 is arranged at a predetermined region of the semiconductor substrate 50. For example, the interconnection layer 52 can be a metal layer formed by using a damascene process in the insulation layer on the silicon substrate. The entire surface of the semiconductor substrate 50 having the interconnection layer 52 is covered by a bottom dielectric layer 54. The bottom plate electrode 56 and the upper plate electrode 64a are arranged at a predetermined region on the bottom dielectric layer 54. A capacitor dielectric layer is interposed between the bottom plate electrode 56 and the upper plate electrode 64a and composed of a middle dielectric layer 58 and an oxide pattern 62. The middle dielectric layer 58 covers the bottom plate electrode 56 and the bottom dielectric layer 54 on the interconnection layer 52. The oxide pattern 62 is interposed between the middle dielectric layer 58 and the upper plate electrode 64a. The middle dielectric layer 58 and the bottom dielectric layer 54 are preferably formed of the same material. The oxide pattern 62 is preferably formed of oxide with a high dielectric constant. For example, the oxide pattern 62 can be formed of a material selected from a group comprising silicon oxide, tantalum oxide and titanium oxide.

An interlayer dielectric layer 68 is formed to cover the bottom plate electrode 56, the upper plate electrode 64a and the middle dielectric layer 58. The interlayer dielectric layer 68 is preferably formed of a material with a low dielectric constant to increase the operation speed of the semiconductor device and to improve frequency performance thereof. For example, the interlayer dielectric layer 68 can be formed of a material selected from a group comprising fluorinated silicate glass (FSG) and silicon oxy-carbide (SiOC). An upper dielectric layer 66 is interposed between the upper plate electrode 64a and the interlayer dielectric layer 68. The upper dielectric layer 66 is extended onto the middle dielectric layer 58 and interposed between the middle dielectric layer 58 and the interlayer dielectric layer 68. The bottom dielectric layer 54, the middle dielectric layer 58 and the upper dielectric layer 66 have etch selectivities with respect to the interlayer dielectric layer 68. Also, the bottom dielectric layer 54, the middle dielectric layer 58 and the upper dielectric layer 66 are preferably formed of the same material. For example, the dielectric layers 54, 58 and 66 can be formed of silicon nitride or silicon carbide. An upper electrode plug 76, a bottom electrode plug 74 and an interconnection plug 72 are arranged in the interlayer dielectric layer 68. The upper electrode plug 76 is connected to the upper plate electrode 64a by sequentially penetrating the interlayer dielectric layer 68 and the upper dielectric layer 66. The bottom electrode plug 74 is connected to the bottom plate electrode 56 by sequentially penetrating the interlayer dielectric layer 68, the upper dielectric layer 66 and the middle dielectric layer 58. The interconnection plug 72 is connected to the interconnection layer 52 by sequentially penetrating the interlayer dielectric layer 68, the upper dielectric layer 66, the middle dielectric layer 58 and the bottom dielectric layer 54.

The upper electrode plug 76, the bottom electrode plug 74 and the interconnection plug 72 can be formed of copper or aluminum. Preferably, the plugs 72, 74, and 76 can be formed of copper which has lower resistance than aluminum. Although not illustrated in the drawings, barrier metal layers can be additionally interposed between the interlayer dielectric layer 68 and each of the plugs 72, 74 and 76. The barrier metal layer functions as a glue layer and a diffusion barrier layer therebetween. A mold layer 80 is formed on the interlayer dielectric layer 68 having the plugs 72, 74, and 76. An etch stopping layer 78 can be additionally interposed between the interlayer dielectric layer 68 and the mold layer 80. Metal interconnections 84 are connected to the plugs 76, 74 and 72, respectively, by sequentially penetrating the mold layer 80 and the etch stopping layer 78. The metal interconnection 84 can be formed of copper or aluminum. The mold layer 80 may be formed of silicon oxide such as a material selected from a group consisting of FSG and silicon oxycarbide. Also, the etch stopping layer 78 can be formed of silicon nitride or silicon carbide.

FIGS. 6 through 17 illustrate process cross-sectional views showing a method of forming a semiconductor device having the capacitor of the MIM structure according to the first embodiment of the present invention.

Figure 6:
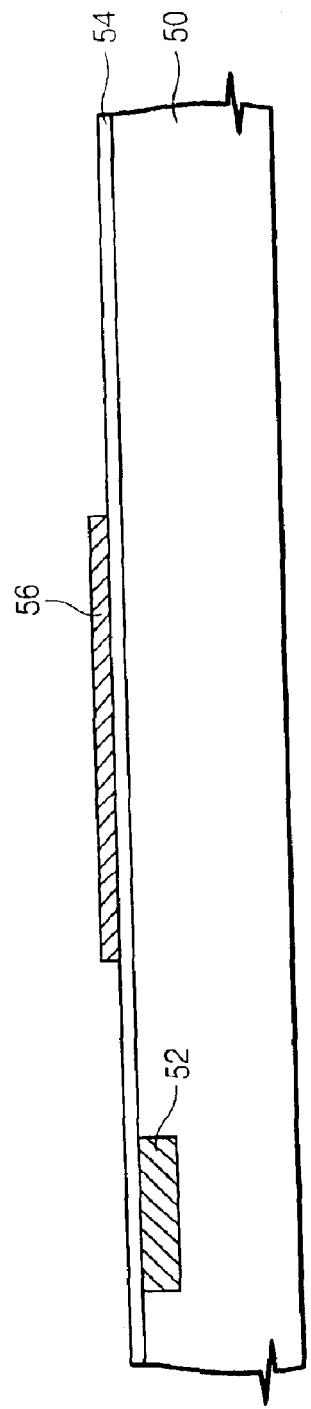

Referring to FIG. 6, an interconnection layer 52 is formed at a predetermined region of a semiconductor substrate 50. The semiconductor substrate 50 can be a silicon substrate which is covered by an insulation layer or not covered. A bottom dielectric layer 54 is formed at the entire surface of the semiconductor substrate 50 having the interconnection layer 52. The bottom dielectric layer 54 is preferably formed of silicon nitride or silicon carbide at a thickness of 200~1000 Å. A bottom plate electrode 56 is formed at a predetermined region on the bottom dielectric layer 54. In order to form the bottom plate electrode 56, a bottom electrode layer is formed on the bottom dielectric layer 54 and patterned. For example, the bottom plate electrode 56 can be formed of a material selected from a group comprising titanium nitride, tantalum nitride and titanium tungsten. The bottom plate electrode 56 preferably has a relatively thin thickness of about 200~1000 Å.

Figure 7:
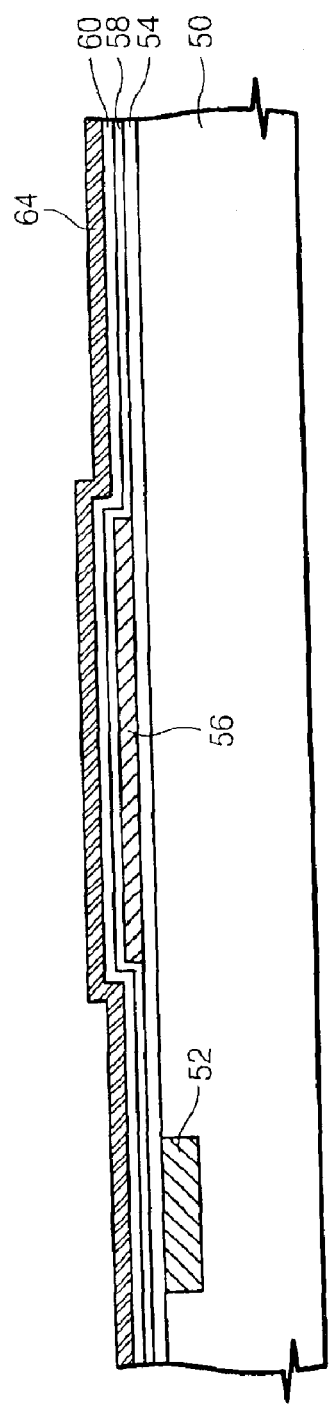

Referring to FIG. 7, a middle dielectric layer 58, an oxide layer 60, and an upper electrode layer 64 are sequentially formed at the entire surface of the semiconductor substrate 50 where the lower plate electrode 56 is formed. The middle dielectric layer 58 is a dielectric layer having etch selectivity with respect to the oxide layer 60, and for example, is preferably formed of silicon nitride or silicon carbide. The middle dielectric layer 58 and the oxide layer 60 are preferably formed with a thickness of 100~500 Å. Also, the oxide layer 60 is preferably formed of silicon oxide or a material selected from a group composed of tantalum oxide, titanium oxide and aluminum oxide, which have high dielectric constants. The upper electrode layer 64 is a metal compound, and for example, can be formed of a material selected from a group composed of titanium nitride, tantalum nitride and titanium tungsten. The upper electrode layer 64 is preferably formed with a relatively thin thickness of 2001~1000 Å.

Referring to FIGS. 8 and 9, the upper electrode layer 64 and the oxide layer 60 are sequentially patterned to form an upper plate electrode 64a overlapped with a portion of the bottom plate electrode 56 and to form an oxide pattern 62 interposed between the upper plate electrode 64a and the middle dielectric layer 58. In one embodiment, the upper plate electrode 64a laterally extends from the region over the bottom plate electrode 56 as illustrated in FIG. 8. Alternatively, the upper plate electrode 64b is located over the lower plate electrode 56 as illustrated in FIG. 9. The middle dielectric layer 58 prevents damage to the bottom plate electrode 56 while the oxide layer 62 is etched. The bottom plate electrode 56 and the upper plate electrode 64a correspond to capacitor electrodes, and the middle dielectric layer 58 and the oxide pattern 62, interposed between the bottom plate electrode 56 and the upper plate electrode 64a, correspond to capacitor dielectric layers.

Figure 10:
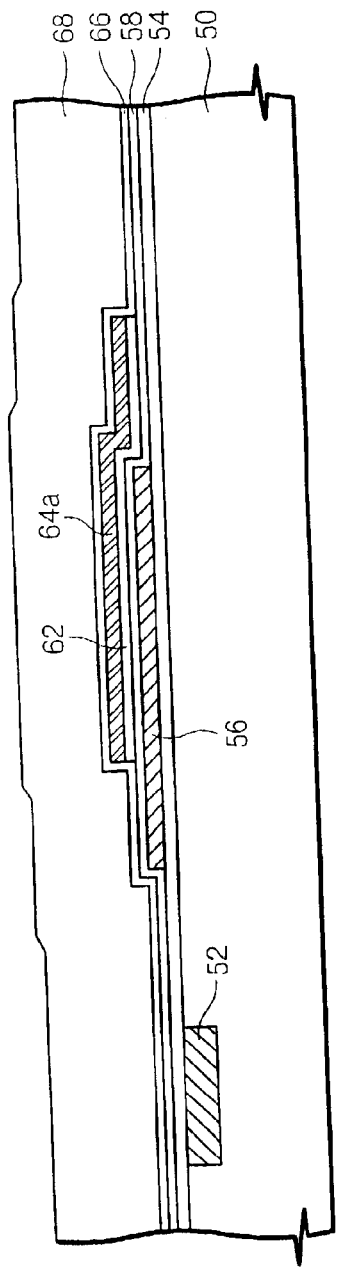

Referring to FIG. 10, an upper dielectric layer 66 is formed on the entire surface of the semiconductor substrate 50 where the upper plate electrode 64a is formed. The dielectric layer 66 covers the entire surface of the upper plate electrode 64a and an exposed surface of the middle dielectric layer 58. The upper dielectric layer 66 is formed of the same material as the dielectric layer 58 and the bottom dielectric layer 54, and for example, is preferably formed of silicon nitride or silicon carbide. The upper dielectric layer 66 is preferably formed with a thickness of 200~1000 Å.

An interlayer dielectric layer 68 is formed on the upper dielectric layer 66. The interlayer dielectric layer 68 is preferably formed of a material which has a low dielectric constant. This results in decreasing parasitic capacitance, and increasing operation speed and frequency performance of the semiconductor device. The interlayer dielectric layer 68 is a kind of silicon oxide, and for example, can be formed of fluorinated silicate glass (FSG) or silicon oxy-carbide. After being formed, the interlayer dielectric layer 68 can be planarized, but since the capacitor according to the present invention has a plate electrode, the thickness of the capacitor is thin. Thus, the process of planarizing the interlayer dielectric layer 68 can be omitted.

Figure 11:
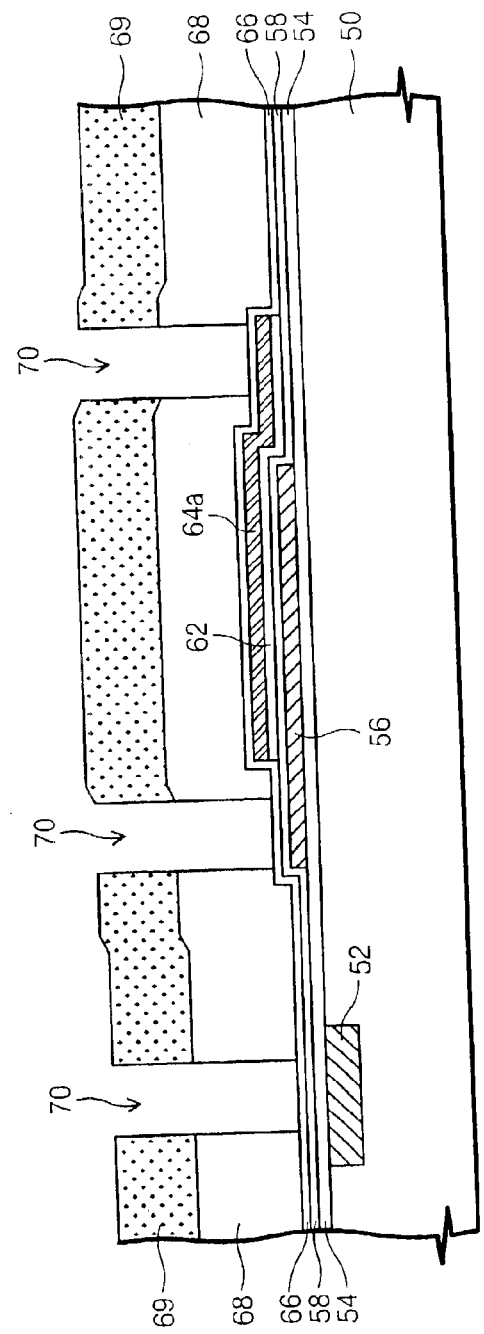

Referring to FIG. 11, a photoresist pattern 69 is formed on the interlayer dielectric layer 68 and is used as an etch mask to pattern the interlayer dielectric layer 68 and to form via holes 70 exposing the upper dielectric layer 66. Since the interlayer dielectric layer 68 has an etch selectivity with respect to the upper dielectric layer 66, the upper dielectric layer 66 can be used as an etch stopping layer to etch the interlayer dielectric layer.

Figure 12:
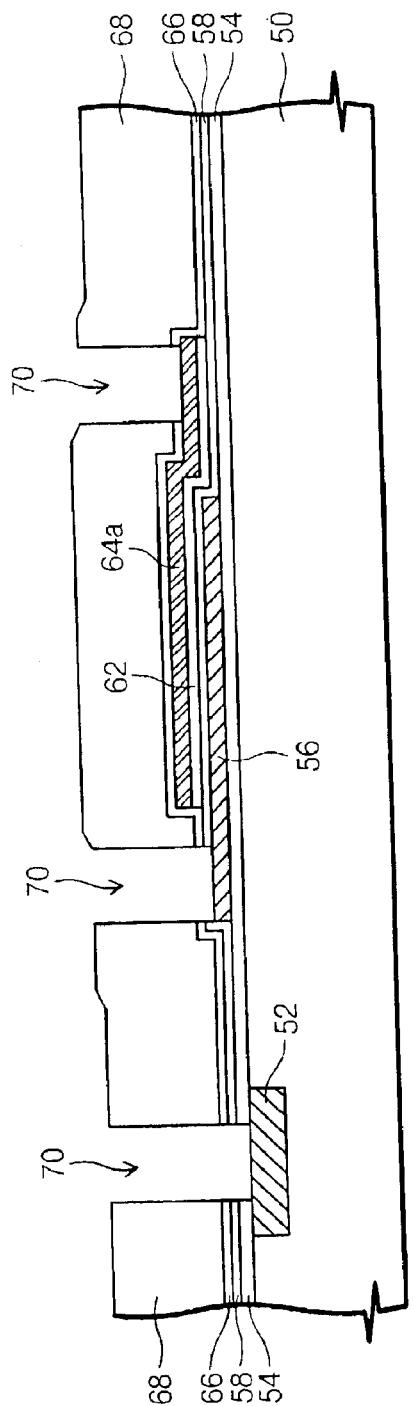

Referring to FIG. 12, using the photoresist pattern 69, the upper dielectric layer 66, the middle dielectric layer 58 and the bottom dielectric layer 54, exposed in the via holes, are etched to expose predetermined regions of the interconnection layer 52, the bottom plate electrode 56 and the upper plate electrode 64a. The photoresist pattern 69 is removed. The upper plate electrode 64a is exposed by etching the upper dielectric layer 66, the bottom plate electrode 56 is exposed by sequentially etching the upper dielectric layer 66 and the middle dielectric layer 58, and the interconnection layer 52 is exposed by sequentially etching the upper dielectric layer 66, the middle dielectric layer 58 and the bottom dielectric layer 54.

Figure 13:
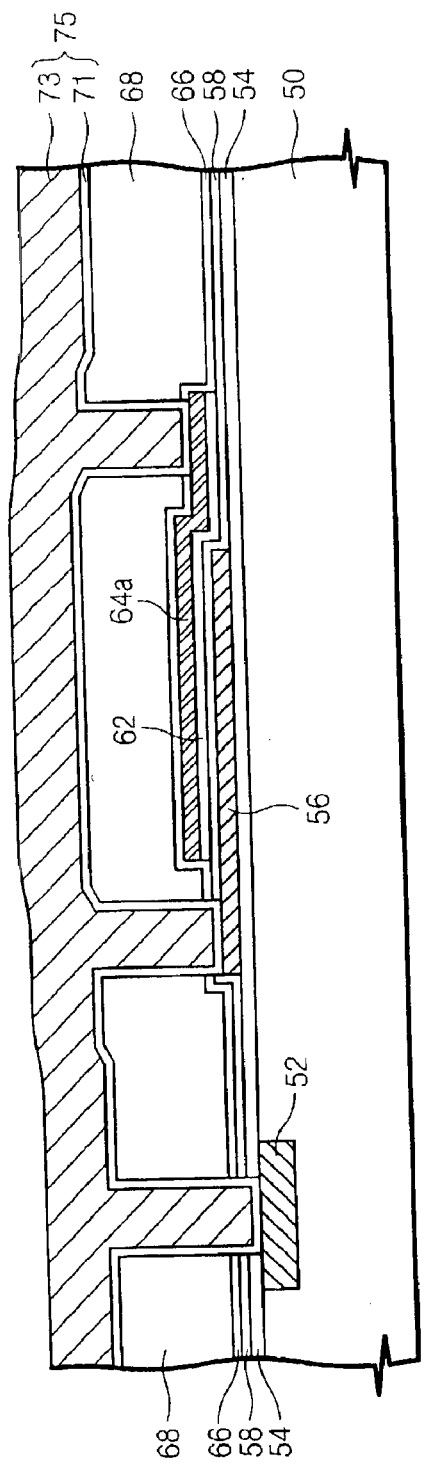

Referring to FIG. 13, a metal layer 75 is formed to fill the via holes 70 on the interlayer dielectric layer 68 having the via holes 70. The conductive layer can be formed of copper or aluminum. Also, a barrier metal layer (not shown in figures) can be additionally formed on the interlayer dielectric layer 68 before forming the metal layer 75. The metal layer 75 can be formed using sputtering, CVD or electroplating. For example, in the case of forming the metal layer 75 using the copper electroplating method, a seed Cu layer 71 is formed on the interlayer dielectric layer 68 where the via holes 70 are formed. The seed Cu layer 71 is preferably formed with a thickness of 500~2000 Å. The seed Cu layer 71 can be formed by sputtering Cu. A Cu layer 73 is formed on the seed Cu layer 71 by applying electroplating with respect to the semiconductor substrate with the seed Cu layer 71. Thus, the via holes 70 are filled with a metal layer 75 composed of the seed Cu layer 71 and the Cu layer 73.

Referring to FIG. 14, the metal layer 75 is polished using a CMP process. At this time, the upper part of the interlayer dielectric layer 68 is simultaneously polished to be planarized. This results in forming conductive plugs in the via holes 70. An interconnection plug 72 is connected to the interconnection layer 52 through the interlayer dielectric layer 68, and an upper electrode plug 76 and a bottom electrode plug 74 are connected to an upper electrode 64a and a bottom electrode 56 through the interlayer dielectric layer 68, respectively. If a barrier metal layer is additionally formed before forming the metal layer 75, it is possible to prevent diffusion of the metal of the plugs 72, 74 and 76 to the interlayer dielectric layer 68 and the resistance is increased thereby.

Referring to FIG. 15, a mold layer 80 is formed on the interlayer dielectric layer 68 where the interconnection plug 72, the bottom electrode plug 74 and the upper electrode plug 76 are formed. An etch stopping layer 78 is preferably formed on the interlayer dielectric layer 68 before forming the mold layer 80. The etch stopping layer 78 prevents etching of the interlayer dielectric layer 68 while the mold layer is patterned in the metal interconnection process that is sequentially processed. The mold layer 80 is formed of a material of a low dielectric constant, and for example, is formed of FSG or silicon oxy-carbide(SiOC). The etch stopping layer 78 is formed of a material having an etch selectivity with respect to the mold layer 80 and the interlayer dielectric layer 68, and preferably is formed of silicon nitride or silicon oxy carbide.

Figure 16:
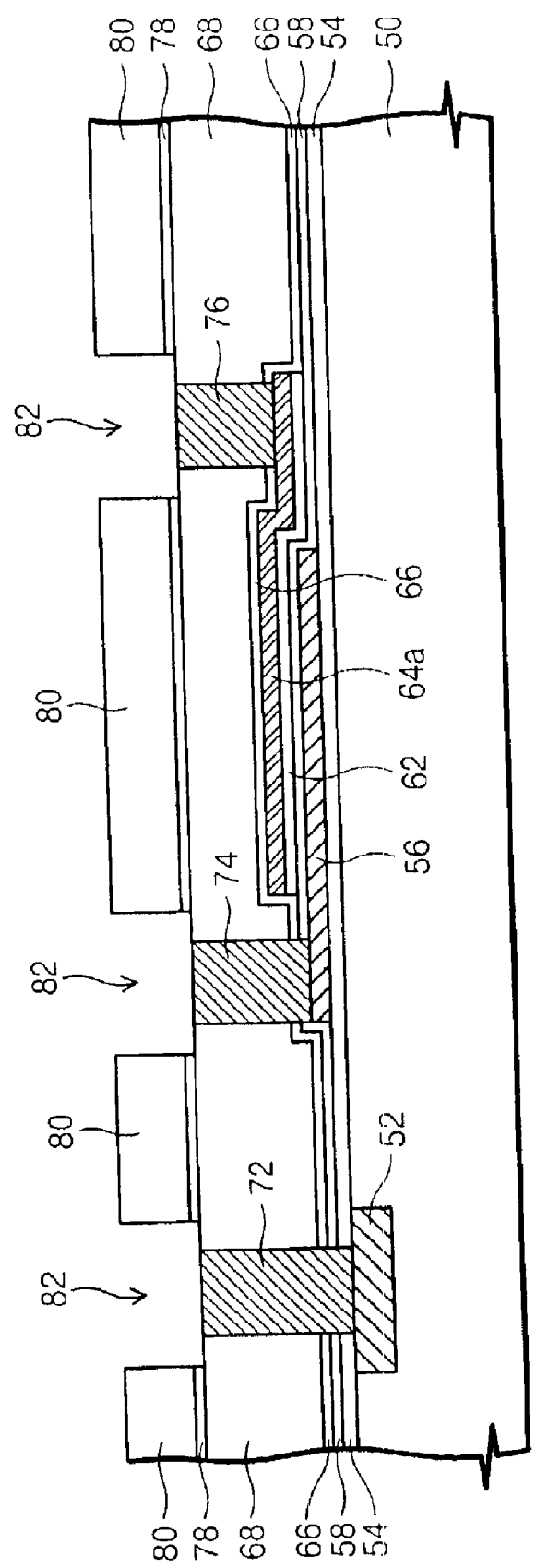

Referring to FIG. 16, the mold layer 80 and the etch stopping layer 78 are sequentially patterned to form grooves 82 exposing the plugs 72, 74 and 76. At this time, the mold layer 80 is etched using the etch stopping layer 78 as a stopping layer, and then the etch stopping layer 78 is removed. That is, the mold layer 80 and the etch stopping layer 78 are etched using two steps, to prevent the interlayer dielectric layer 68 from being unnecessarily etched.

Figure 17:
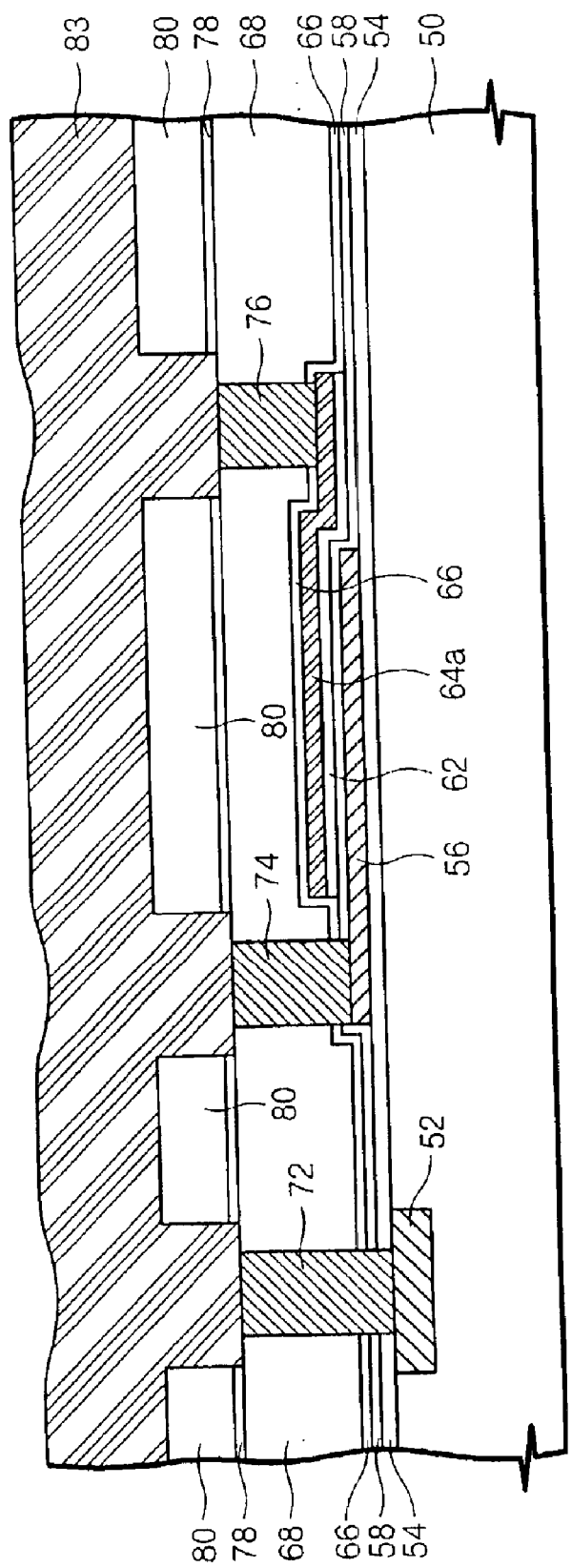

Referring to FIG. 17, a metal layer 83 is formed on the mold layer 80 to fill the grooves 82. The metal layer 83 is preferably formed of copper or aluminum. Also, the metal layer 83 can be formed using a CVD method, a sputtering method or an electroplating method.

The metal layer 83 is polished using a CMP process to form a metal interconnection 84 as illustrated in FIG. 5. The metal interconnection 84 is selectively connected to the interconnection plug 72, the bottom electrode plug 74 and the upper electrode plug 76 according to the design of the grooves 82.

Embodiment 2

Figure 18:
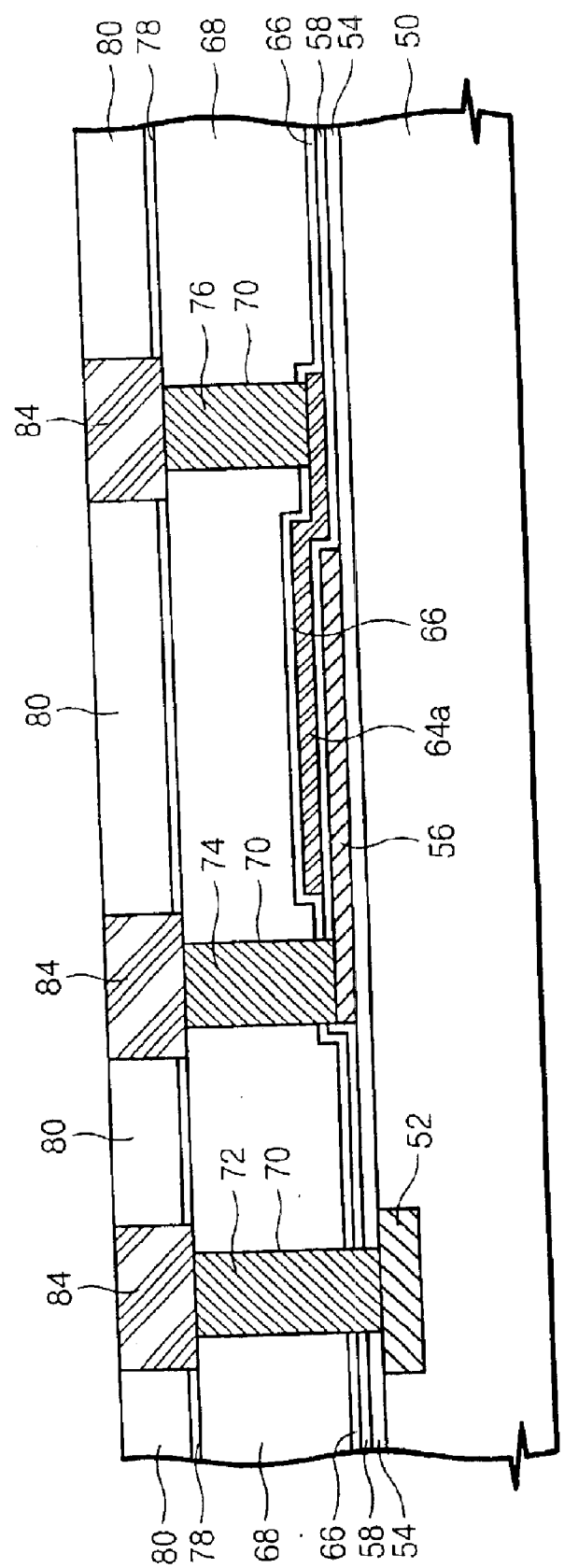
FIG. 18 illustrates a cross-sectional view illustrating a semiconductor device having a capacitor of an MIM structure according to a second embodiment of the present invention.

FIG. 18 illustrates a cross-sectional view showing a semiconductor device having a capacitor of an MIM structure according to a second embodiment of the present invention.

Referring to FIG. 18, a semiconductor device in accordance with a second embodiment of the present invention is similar to the semiconductor device in accordance with the first embodiment. That is, the semiconductor device according to the second embodiment of the present invention comprises a bottom plate electrode 56 and an upper plate electrode 64a. The upper plate electrode 64a is overlapped with a portion of the bottom plate electrode 56. The bottom plate electrode 56 and the upper plate electrode 64a are formed of metal compounds. For example, the upper plate electrode 64a and the bottom plate electrode 56 can be formed of a material selected from a group composed of titanium nitride (TiN), tantalum nitride (TaN) and titanium tungsten (TiW). The bottom plate electrode 56 and the upper plate electrode 64a have a relatively thin thickness of 200~1000 Å. An interconnection layer 52 is disposed at a predetermined region of the semiconductor substrate 50. For example, the interconnection layer 52 can be a metal layer which is formed at an isolation layer on the silicon substrate using damascene process. A bottom dielectric layer 54 covers the entire surface of the semiconductor substrate having the interconnection layer 52. The bottom plate electrode 56 and the upper plate electrode 64a are disposed at a predetermined region on the bottom dielectric layer 54. A middle dielectric layer 58 covers the bottom plate electrode 56, the bottom dielectric layer 54 and the interconnection layer 52. The middle dielectric layer 58, interposed between the upper plate electrode 64a and the bottom plate electrode 56, corresponds to a capacitor dielectric layer. The middle dielectric layer 58 and the bottom dielectric layer 54 are preferably formed of the same material.

An interlayer dielectric layer 68 is formed on the middle dielectric layer 58 and the upper plate electrode 64a. The interlayer dielectric layer 68 can be formed of a low dielectric material having a low dielectric constant like the first embodiment. An upper dielectric layer 66 is interposed between the upper plate electrode 64a and the interlayer dielectric layer 68. The upper dielectric layer 68 is extended to the top of the middle dielectric layer 58, and interposed between the middle dielectric layer 58 and the interlayer dielectric layer 68. An upper electrode plug 76, a bottom electrode plug 74 and an interconnection plug 72 are disposed in the interlayer dielectric layer. The upper electrode plug 76 is connected to the upper plate electrode 64a by sequentially penetrating the interlayer dielectric layer 68 and the upper dielectric layer 66. The bottom electrode plug 74 is connected to the bottom plate electrode 56 by sequentially penetrating the interlayer dielectric layer 68, the upper dielectric layer 66 and the middle dielectric layer 58. The interconnection plug 72 is connected to the interconnection layer 52 by sequentially penetrating the interlayer dielectric layer 68, the upper dielectric layer 66, the middle dielectric layer 58 and the bottom dielectric layer 54.

Although not shown, a barrier metal layer can be further interposed between the interlayer dielectric layer 68 and each of the upper electrode plug 76, the bottom electrode plug 74 and the interconnection plug 72. The barrier metal layer functions as a glue layer and a diffusion barrier layer between the interlayer dielectric layer 68 and the plugs 72, 74 and 76. A mold layer 80 covers the entire surface of the interlayer dielectric layer 68 having the upper electrode plug 76, the bottom electrode plug 74 and the interconnection plug 72. An etch stopping layer 78 can be further interposed between the interlayer dielectric layer 68 and the mold layer 80. Metal interconnections 52 are formed at the upper electrode plug 76, the bottom electrode plug 74 and the interconnection plug 72, by sequentially penetrating the mold layer 80 and the etch stopping layer 78. The upper plate electrode 64a can be disposed on the bottom plate electrode 56 as illustrated in FIG. 9. At this time, the upper electrode plug 76 is also connected to the upper plate electrode 64a over the bottom plate electrode 56 as illustrated in FIG. 9.

As described above, the semiconductor device according to the second embodiment of the present invention has a similar structure to that according to the first embodiment, and is formed of the same materials with the components corresponding to the semiconductor device according to the first embodiment. In the semiconductor device according to the first embodiment, the middle dielectric layer and the multiple capacitor dielectric layer of the oxide pattern are interposed between the bottom plate electrode 56 and the upper plate electrode 64a. But, in the semiconductor device according to the second embodiment, while the middle dielectric layer 58 is interposed between the bottom plate electrode 56 and the upper plate electrode 64a, the oxide pattern 62 of FIG. 5 is not interposed therebetween.

Figure 19:
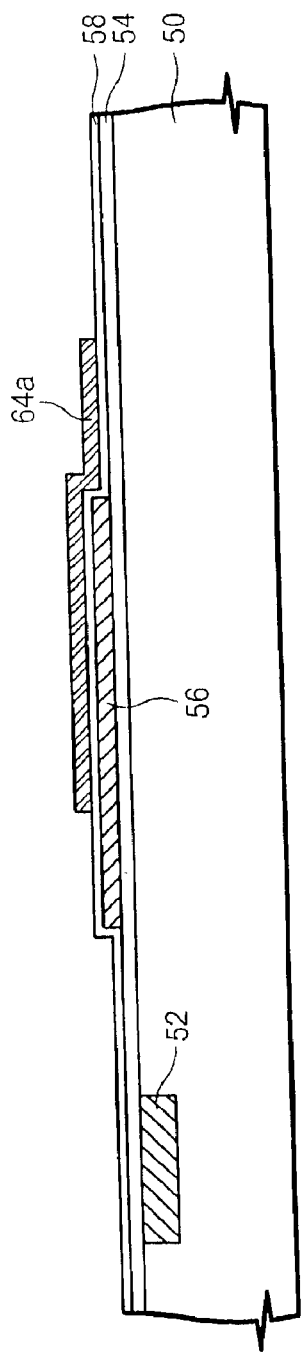
FIGS. 19 through 21 illustrate process cross-sectional views illustrating a method of forming a semiconductor device having the capacitor of the MIM structure according to the second embodiment of the present invention.
Figure 20:
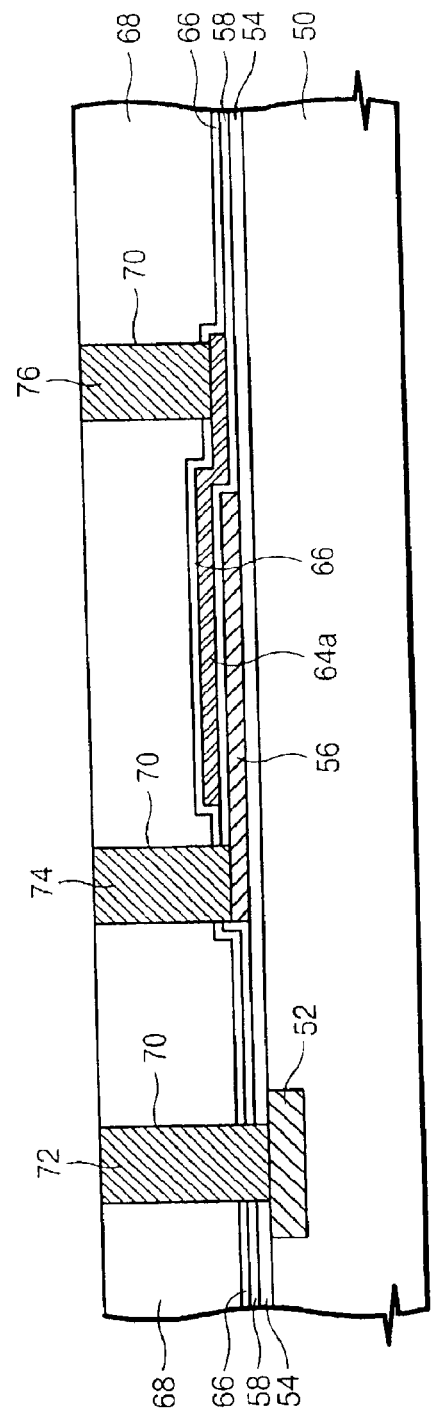
Figure 21:
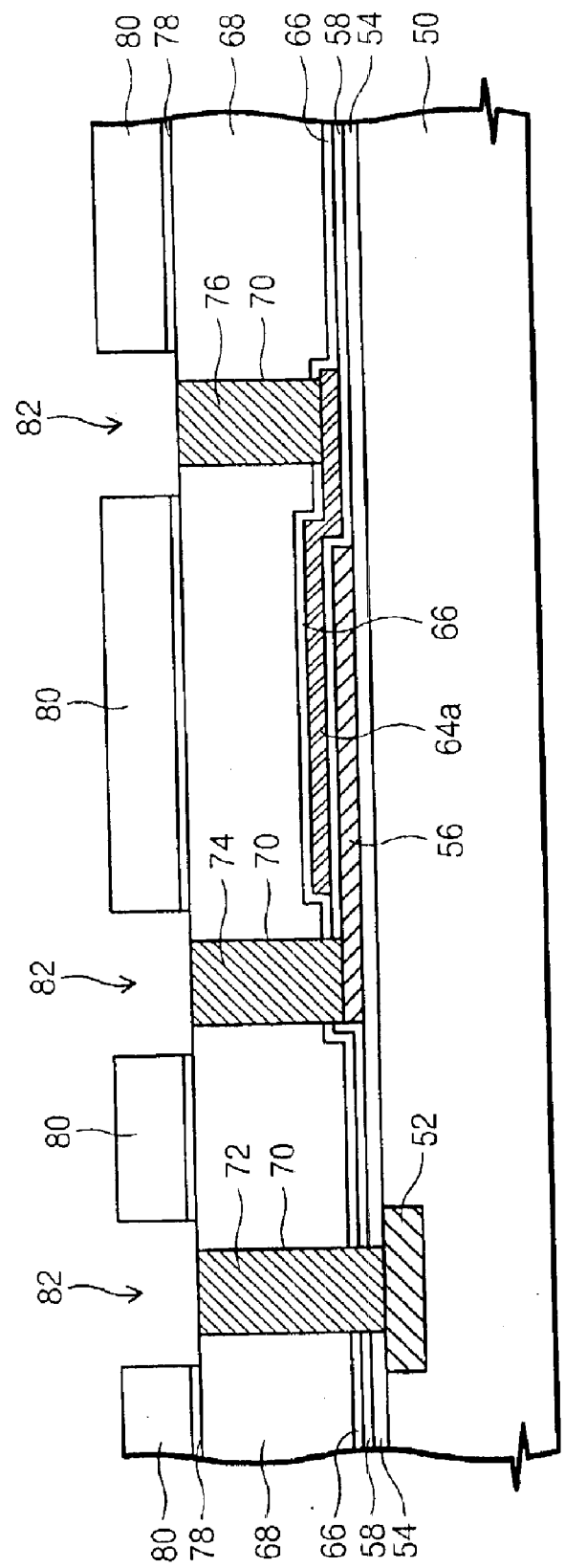

FIGS. 19 through 21 illustrate process cross-sectional views showing a method of forming a semiconductor device having the capacitor of the MIM structure according to the second embodiment of the present invention.

Referring to FIG. 19, an interconnection layer 52 is formed at a predetermined region of a semiconductor substrate 50. The semiconductor substrate 50 can be a silicon substrate which is covered by an insulation layer or not covered. A bottom dielectric layer 54 is formed on the semiconductor substrate 50 having the interconnection layer 52. The bottom dielectric layer 54 is preferably formed of a silicon nitride or silicon carbide with a thickness of 200~1000 Å. A bottom plate electrode 56 is formed on a predetermined region of the bottom dielectric layer 54. The bottom plate electrode 56 can be formed of a material selected from a group of comprising titanium nitride, tantalum nitride and titanium tungsten. The bottom plate electrode 56 is preferably formed with a relatively thin thickness of 200~1000 Å. A middle dielectric layer 58 is formed at an entire surface of the semiconductor substrate 50 where the bottom plate electrode 56 is formed. An upper plate electrode 64a is formed on the middle dielectric layer 58. The middle dielectric layer 58 is preferably formed of silicon nitride or a silicon carbide with a thickness of 100~500 Å.

The upper plate electrode 64a is preferably formed with a relatively thin thickness of 200~1000 Å. The bottom plate electrode 56 and the upper plate electrode 64a correspond to capacitor electrodes, and the middle dielectric layer 58 interposed between the bottom plate electrode 56 and the upper plate electrode 64a corresponds to a capacitor dielectric layer.

Referring to FIG. 20, an upper dielectric layer 66 and an interlayer dielectric layer 68 are sequentially formed at an entire surface of the semiconductor substrate 50 where the upper plate electrode 64a is formed. The upper dielectric layer 66 is formed of the same material as the middle dielectric layer 58 and the bottom dielectric layer 54, and for example, is formed of silicon nitride or silicon carbide. The upper dielectric layer 66 is preferably formed with a thickness of 200~1000 Å. The interlayer dielectric layer 68 can be formed of FSG or SiOC. Then, an interconnection plug 72 connected to the interconnection layer 52, a bottom electrode plug 74 connected to the bottom plate electrode 56, and an upper electrode plug 76 connected to the upper plate electrode 64a are formed using the same method according to the fist embodiment described with reference to FIGS. 11 through 14. Each of the plugs 72, 74 and 76 is formed by filling via holes 70 in the interlayer dielectric layer.

Referring to FIG. 21, a mold layer 80 having grooves 82 is formed on the interlayer dielectric layer 68 having the plugs 72. The mold layer 80 can be formed through the same steps with the first embodiment described above with reference to FIGS. 15 and 16. That is, a mold layer 80 is formed on the interlayer dielectric layer 68 having the plugs 72, 74, and 76, and patterned to form grooves 82 exposing the plugs 72, 74 and 76. Before forming the mold layer 80, an etch stopping layer 78 can be formed on the interlayer dielectric layer 68 to prevent etching the interlayer dielectric layer 68 while the mold layer is patterned.

A metal layer is formed on the mold layer 80 to fill the grooves 82, and is polished using a CMP process to form a metal interconnection 84 of FIG. 18.

Embodiment 3.

Figure 22:
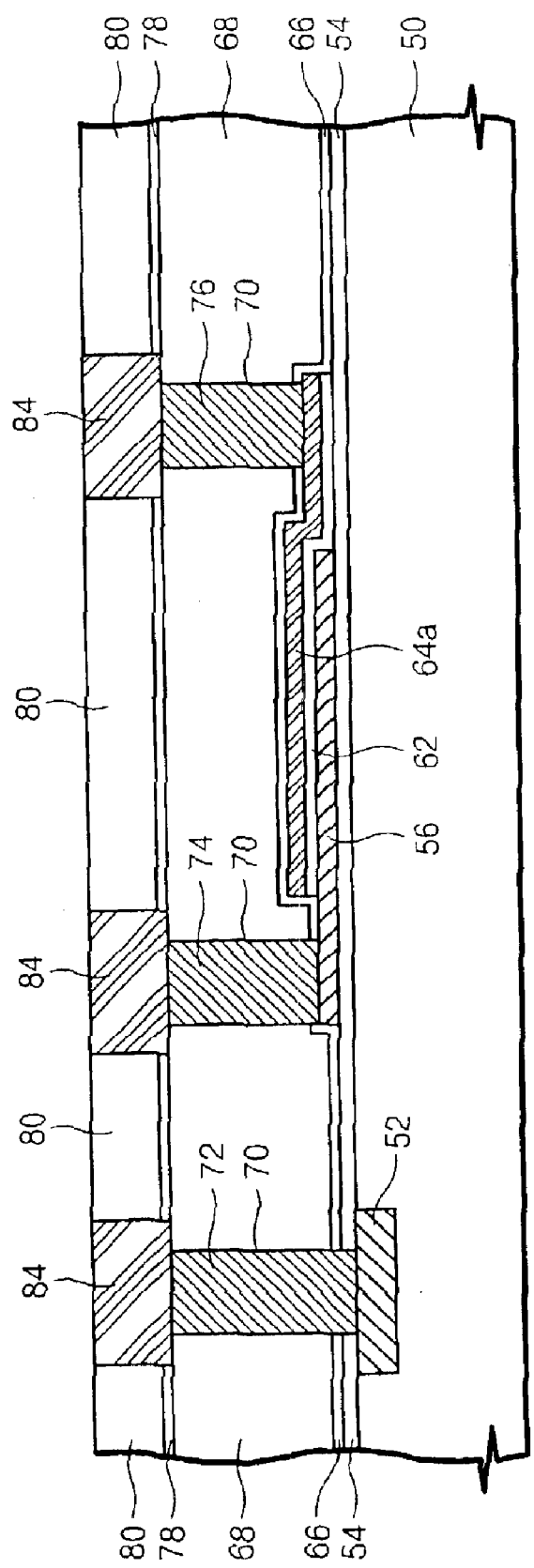
FIG. 22 illustrates a cross-sectional view illustrating a semiconductor device having a capacitor of an MIM structure according to a third embodiment of the present invention.

FIG. 22 illustrates a cross-sectional view showing a semiconductor device having a capacitor of an MIM structure according to a third embodiment of the present invention.

Referring to FIG. 22, a semiconductor device according to the third embodiment does not have a middle dielectric layer 58 of FIG. 5 differently from the described first embodiment. That is, according to the third embodiment, an oxide pattern 62 disposed under the upper plate electrode 64a corresponds to a capacitor dielectric layer of an MIM structure. Also, an interconnection plug 72 is connected to an interconnection layer 52 disposed at a predetermined region of a semiconductor substrate 50 by sequentially penetrating the interlayer dielectric layer 68, an upper dielectric layer 66 and a bottom dielectric layer 54. The bottom electrode plug 74 is connected to a bottom plate electrode 56 by sequentially penetrating the interlayer dielectric layer 68 and the upper dielectric layer 66. The upper electrode plug 76 is connected to an upper plate electrode 64a by sequentially penetrating the interlayer dielectric layer 68 and the upper dielectric layer 66. An etch stopping layer 78, a mold layer 80 and a metal interconnection layer 84 covering the interlayer dielectric layer 68 have the same structures with the first embodiment. The upper plate electrode 64a can be disposed on the bottom plate electrode 56 as described in FIG. 9. At this time, the upper electrode plug 76 is also connected to the upper plate electrode 64a over the bottom plate electrode 56 as illustrated in FIG. 9. The components of the third embodiment corresponding to the first embodiment can be formed of the same materials.

Figure 23:
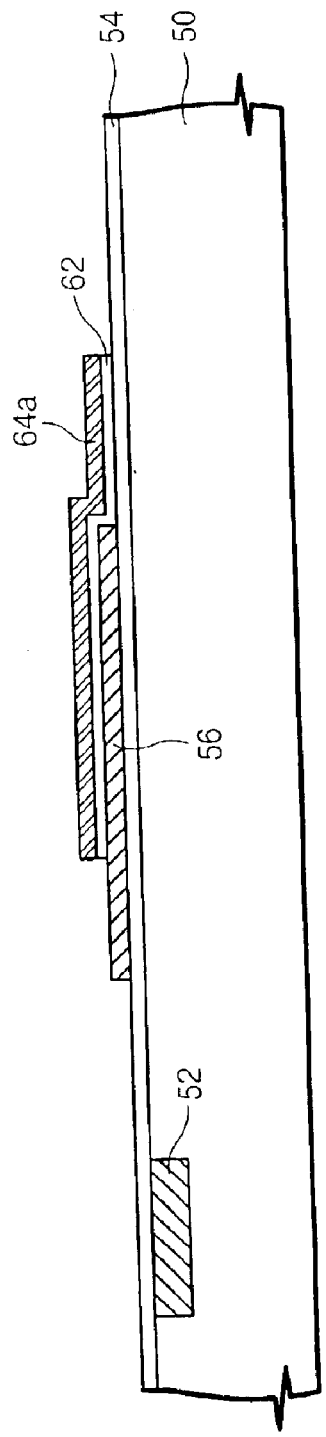
FIGS. 23 through 25 illustrate process cross-sectional views illustrating a method of forming a semiconductor device having the capacitor of the MIM structure according to the third embodiment of the present invention.
Figure 24:
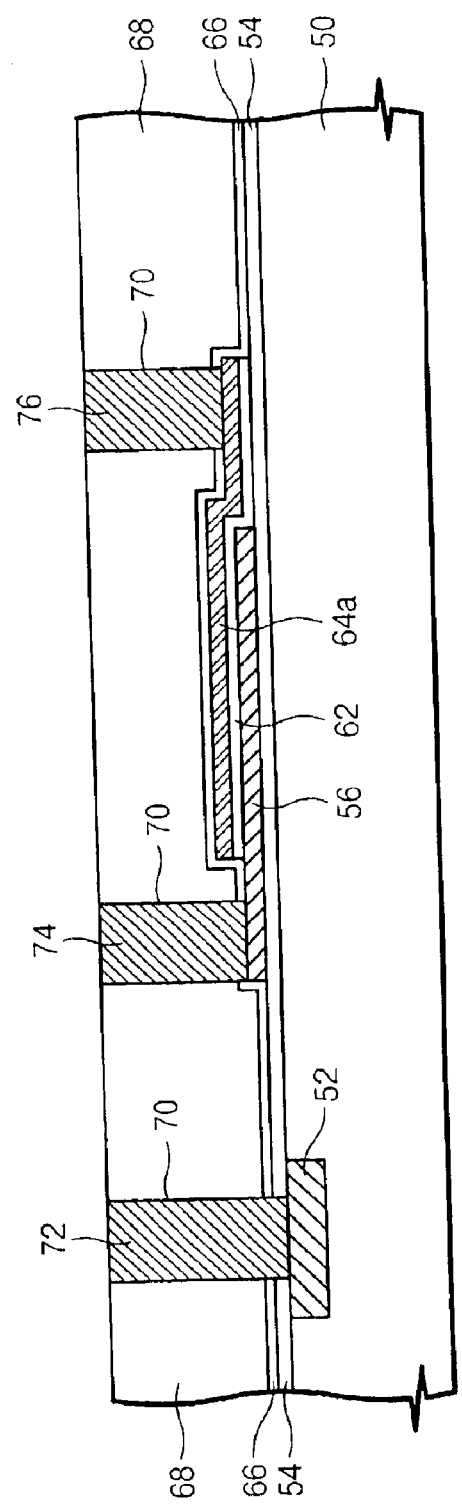
Figure 25:
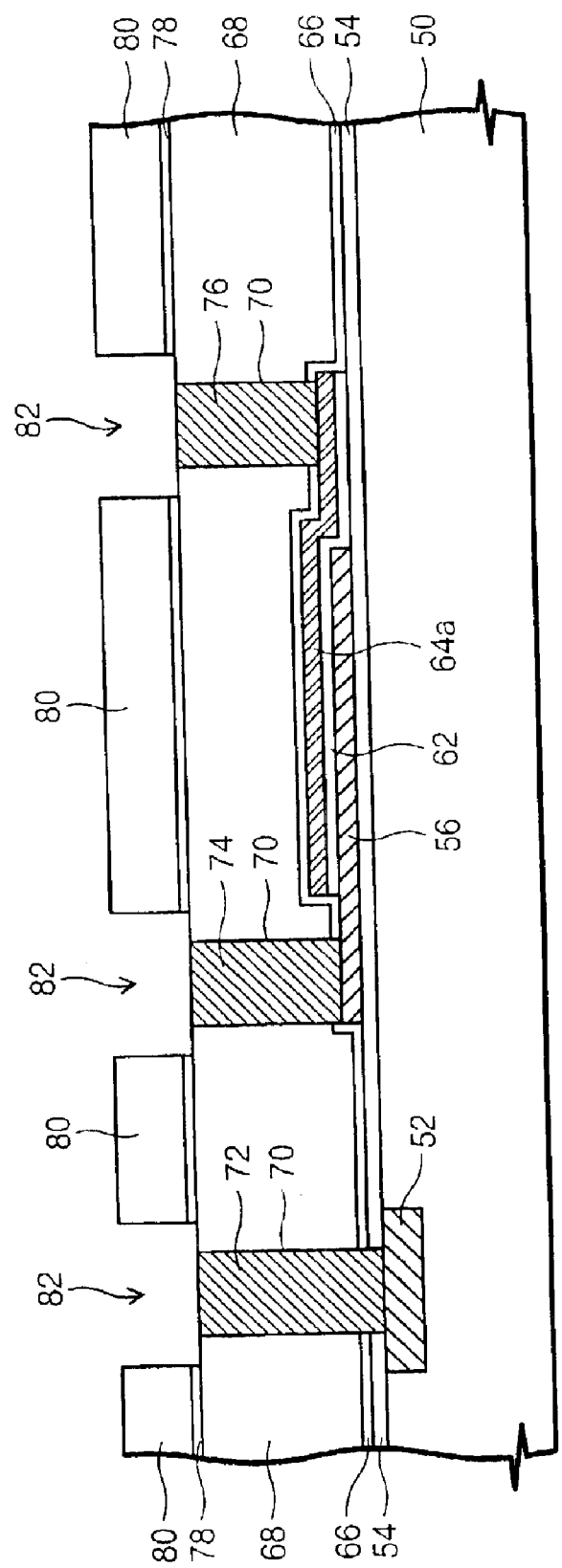

FIGS. 23 through 25 illustrate process cross-sectional views showing a method of forming a semiconductor device having the capacitor of the MIM structure according to the third embodiment of the present invention.

Referring to FIG. 23, an interconnection layer 52 is formed at a predetermined region of a semiconductor substrate 50, and a bottom dielectric layer 54 is formed at an entire surface of the semiconductor substrate 50 having the interconnection layer. Then, a bottom plate electrode 56 is formed on a predetermined region on the bottom dielectric layer 54. An oxide pattern 62 and an upper plate electrode 64a are sequentially stacked to have an overlapped region with the bottom plate electrode 56 thereon. An oxide layer and an upper electrode layer are formed over an entire surface of the bottom dielectric layer 54 where the bottom plate electrode 56 is formed, and is sequentially patterned to form the oxide pattern 62 and the upper plate electrode 64a.

Referring to FIG. 24, an upper dielectric layer 66 is conformally formed at an entire surface of the semiconductor substrate 50 where the upper plate electrode 64a is formed, and an interlayer dielectric layer 68 is formed on the upper dielectric layer 66. Conductive plugs are formed through the interlayer dielectric layer 68. The interlayer dielectric layer 68, the upper dielectric layer 66 and the bottom dielectric layer 54 are sequentially patterned to form via holes 70. Using the same method as that of the first embodiment, an interconnection plug 72 connected to the interconnection layer 52, a bottom electrode plug 74 connected to the bottom plate electrode 56 and an upper electrode plug 76 connected to the upper plate electrode 64a can be formed.

Referring to FIG. 25, a mold layer 80 having grooves is formed on the interlayer dielectric layer 68 having the plugs 72, 74 and 76. The mold layer 80 can be formed through the same steps described above with reference to FIGS. 15 and 16. That is, a mold layer 80 is formed on the interlayer dielectric layer 68 with the plugs 72, 74 and 76, and is patterned to form grooves 82 exposing the plugs 72, 74 and 76. Before forming the mold layer 80, an etch stopping layer 78 can be formed on the interlayer dielectric layer 68 to prevent etching of the interlayer dielectric layer while the mold layer 80 is patterned.

A metal layer is formed to fill the grooves 82 on the mold layer 80 and is polished using a CMP process to form a metal interconnection 84 of FIG. 18 in the grooves 82.

Embodiment 4.

The present embodiment is directed to another method of forming a semiconductor device having an MIM capacitor described as the first embodiment.

The present embodiment introduces a different but similar method to that of the first embodiment. The difference between the present embodiment and the first embodiment is a method of forming metal interconnections connecting with plate electrodes and an interconnection layer.

FIGS. 26, 27A, 27B, 28, 29 and 30 illustrate process cross-sectional views showing a method of forming a semiconductor device having the capacitor of the MIM structure according to the fourth embodiment of the present invention.

Figure 26:
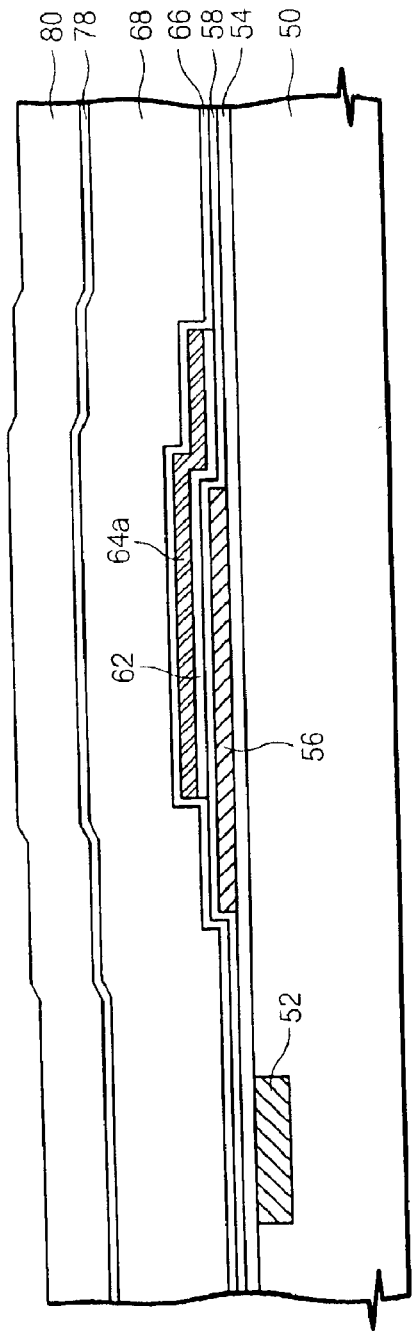
FIGS. 26, 27A, 27B, 28, 29 and 30 illustrate process cross-sectional views illustrating a method of forming a semiconductor device having the capacitor of the MIM structure according to the fourth embodiment of the present invention.

Referring to FIG. 26, an interconnection layer 52 is formed at a predetermined region of a semiconductor substrate 50, and a bottom dielectric layer 54 is formed at an entire surface of the semiconductor substrate 50 having the interconnection layer 52. The semiconductor substrate 50 can be a silicon substrate which is covered by a silicon oxide layer or not. The interconnection layer 52 can be formed of copper or aluminum. In the case that the interconnection layer 52 is formed of copper, the interconnection layer 52 can be formed by a damascene process. The bottom dielectric layer 54 is preferably formed of silicon nitride or silicon carbide. A bottom plate electrode 56 is formed on a predetermined region of the bottom dielectric layer 54. A middle dielectric layer 58 is formed at an entire surface of the semiconductor substrate 50 where the bottom plate electrode 56 is formed. An oxide pattern 62 and an upper plate electrode 64a are sequentially formed to be overlapped with the bottom plate electrode 56 on the middle dielectric layer 58. The entire surfaces of the oxide pattern 62 and the upper plate electrode 64a can be overlapped with the bottom plate electrode 56 as illustrated in FIG. 9. The sidewalls of the oxide pattern 62 and the upper plate electrode 64a are preferably self-aligned. An oxide layer and an upper electrode layer are sequentially formed at an entire surface of the semiconductor substrate having the bottom plate electrode 56 and are successively patterned to form the oxide pattern 62 and the upper plate electrode 64a which are sequentially stacked.

The bottom plate electrode 56 and the upper plate electrode 64a are preferably formed of metal compounds. For example, the bottom plate electrode 56 and the upper plate electrode 64a are preferably formed of a material selected from a group of comprising titanium nitride, tantalum nitride and tantalum tungsten. The bottom plate electrode 56 and the upper plate electrode 64a are preferably formed at a thickness of 200~1000 Å. The middle dielectric layer 58 is preferably formed of a dielectric layer which has an etch selectivity with respect to the oxide pattern 62, for example, silicon nitride or silicon carbide. The oxide pattern 62 is preferably formed of a material selected from a group of comprising silicon oxide, tantalum oxide, titanium oxide and aluminum oxide. The bottom plate electrode 56 and the upper plate electrode 64a correspond to electrodes of a capacitor, and the middle dielectric layer 58 and the oxide pattern 62 interposed between the bottom plate electrode 56 and the upper plate electrode 64a correspond to dielectric layers of a capacitor.

An upper dielectric layer 66, an interlayer dielectric layer 68, an etch stopping layer 78 and a mold layer 80 are sequentially formed at an entire surface of the semiconductor substrate 50 where the upper plate electrode 64a is formed. The upper dielectric layer 66 is preferably formed of the same material with the middle dielectric layer 58 and the bottom dielectric layer 54. For example, the upper dielectric layer 66 is preferably formed of silicon nitride or silicon carbide. The upper dielectric layer 66 has an etch selectivity with respect to the interlayer dielectric layer 68. Additionally, the upper dielectric layer 66 preferably has an etch selectivity with respect to the mold layer 80. The interlayer dielectric layer 68 is preferably formed of an insulation layer which has a low dielectric constant. For example, the interlayer dielectric layer 68 can be formed of FSG or SiOC.

Figure 27A:
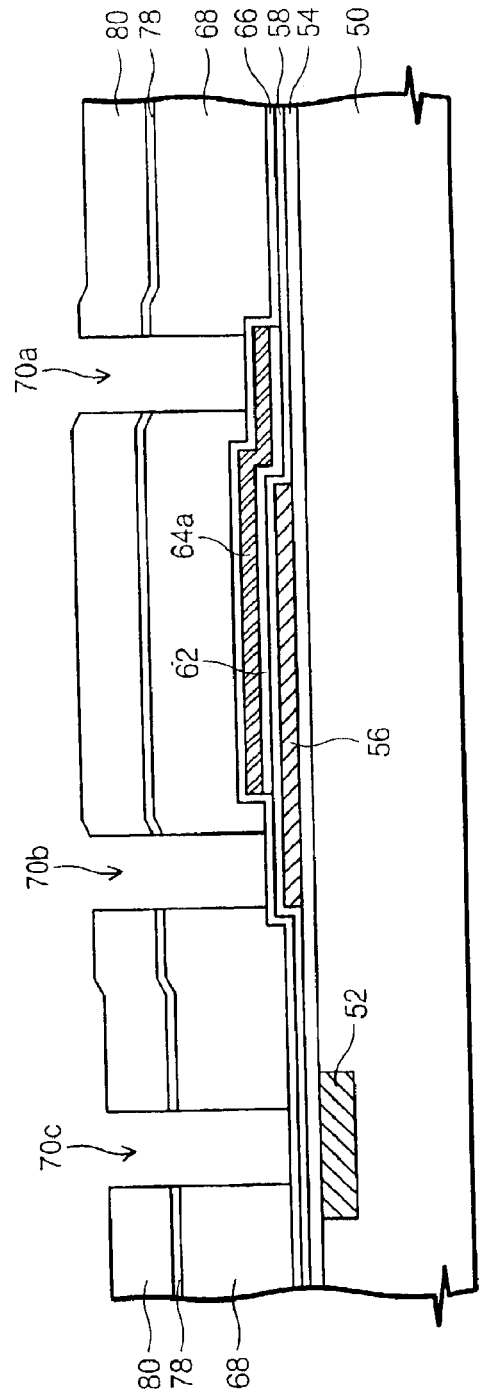
Figure 27B:
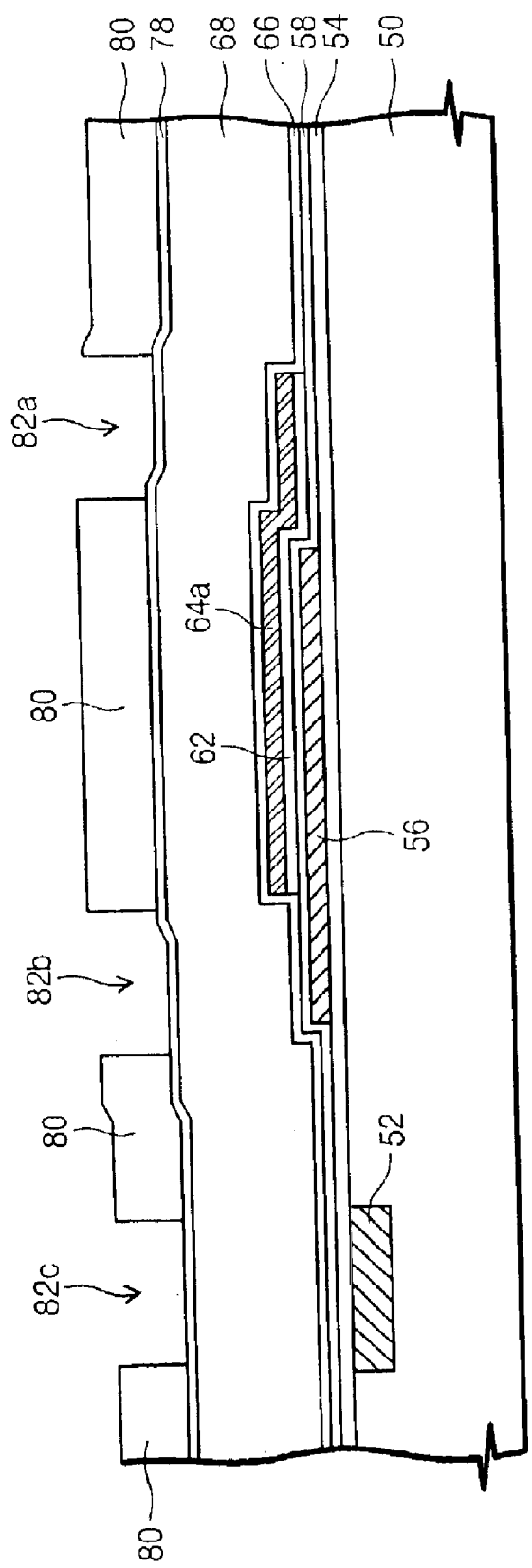
Figure 28:
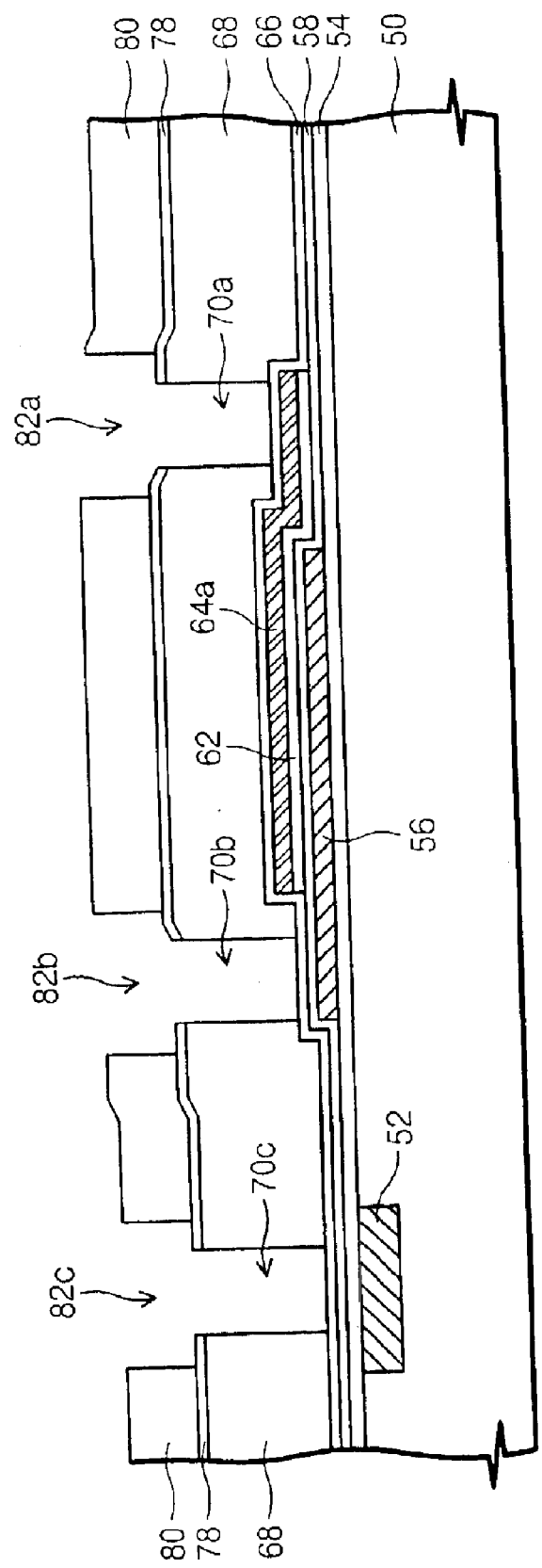

Referring FIGS. 27A, 27B and 28, a first via hole 70a, a second via hole 70b and a third via hole 70c are formed through the interlayer dielectric layer 80 and the etch stopping layer 78 to expose predetermined regions of the upper dielectric layer 66. A first interconnection groove 82a, a second interconnection groove 82b and a third interconnection groove 82c are formed at the mold layer 80 to cross over the first via hole 70a, the second via hole 70b and the third via hole 70c. At this time, the interconnection grooves 82a, 82b, 82c expose predetermined regions of the etch stopping layer 78.

There are two methods of forming the via holes 70a, 70b, and 70c and the interconnection grooves 82a, 82b, and 82c. A first method is described with reference to FIGS. 27A and 28.

The mold layer 80, the etch stopping layer 78 and the interlayer dielectric layer 68 are successively patterned to form the via holes 70a, 70b and 70c which expose predetermined regions of the upper dielectric layer 66. At this time, the upper dielectric layer 66 has an etch selectivity with respect to the interlayer dielectric layer 68 so as to function as an etch stopper. The first via hole 70a and the second via hole 70b expose predetermined regions of the upper dielectric layer 66 located over the upper plate electrode 64a and the bottom plate electrode 56, respectively. The third via hole 70c exposes a predetermined region of the upper dielectric layer 66 located over the interconnection layer 52.

Then, the mold layer 80 is patterned by using the etch stopping layer 78 as an etch stopper, to form the interconnection grooves 82a, 82b, and 82c which cross over the via holes 70a, 70b, and 70c, respectively. The etch stopping layer 78 has an etch selectivity with respect to the mold layer 80 to protect the interlayer dielectric layer from being etched. The upper dielectric layer 66 exposed by the via holes 70a, 70b, and 70c protects the bottom plate electrode 56, the upper plate electrode 64a and the interconnection layer 52 from being etched.

Next, a second method of forming the via holes 70a, 70b, and 70c and the interconnection grooves 82a, 82b, and 82c is described with reference to FIGS. 27B and 28. In the second method, after forming the interconnection grooves 82a, 82b, and 82c, the via holes 70a, 70b, and 70c are formed.

The mold layer 80 is patterned to form the interconnection grooves 82a, 82b, and 82c which expose predetermined regions of the etch stopping layer 78. Then, predetermined regions of the exposed etch stopping layer 78 and the interlayer dielectric layer 68 are successively patterned to form via holes 70a, 70b, and 70c which expose predetermined regions of the upper dielectric layer 66. In the second method, it is possible to reduce etch damage of the upper dielectric layer 66 by forming first the interconnection grooves 82a, 82b, and 82c and second the via holes 70a, 70b, and 70c.

Figure 29:
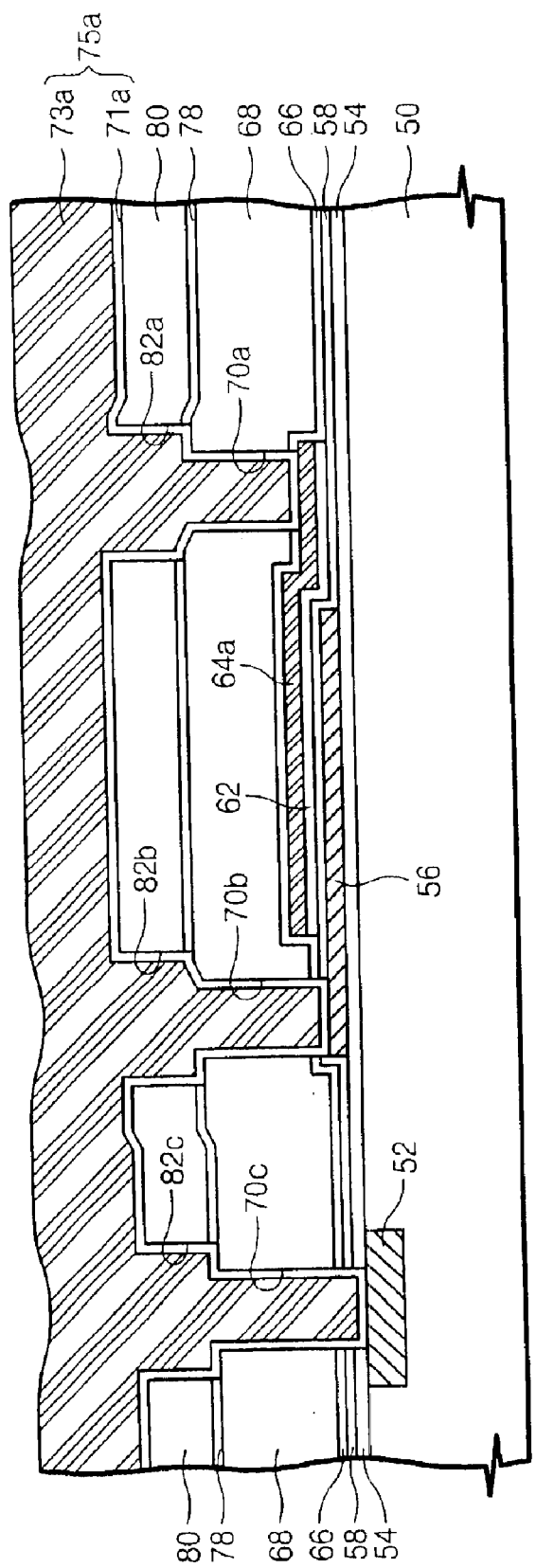

Referring to FIG. 29, the upper dielectric layer 66 exposed by the via holes 70a, 70b, and 70c, the middle dielectric layer 58 and the bottom dielectric layer 54 are successively etched to expose predetermined regions of the upper plate electrode 64a, the bottom plate electrode 56 and the interconnection layer 52. At this time, the patterning process is preferably performed by an etch-back process. Thus, the etch stopping layer 78 exposed by the interconnection grooves 82a, 82b, and 82c is simultaneously etched. The upper plate electrode 64a is exposed by etching the upper dielectric layer 66, and the bottom plate electrode 56 is exposed by sequentially etching the upper and middle dielectric layers 66, and 58. The interconnection layer 52 is exposed by sequentially etching the upper, middle and bottom dielectric layers 66, 58 and 54.

Then, a metal layer 75a is formed on an entire surface of the semiconductor substrate 50 where the upper plate electrode 64a, the bottom plate electrode 56 and the interconnection layer 52 are exposed, to fill the interconnection grooves 82a, 82b, 82c and the via holes 70a, 70b, and 70c. The metal layer 75a can be formed of copper or aluminum. Also, before forming the metal layer 75a, a barrier metal layer (not illustrated in figures) can be conformally formed at sidewalls and bottom surfaces of the interconnection grooves 82a, 82b, 82c and the via holes 70a, 70b, and 70c. The barrier metal layer prevents metal elements contained in the metal layer 75a from being diffused to the mold layer 80 or to the interlayer dielectric layer 68. The barrier metal layer can be formed of titanium nitride or tantalum nitride. Alternatively, the barrier metal layer can be formed of metal compounds having a dense structure.

The metal layer 75a can be formed by sputtering, CVD or electroplating. For example, in the case that the conductive layer 75a is formed by a copper electroplating method, a copper seed layer 71a is formed at the semiconductor substrate 50 where the interconnection grooves 82a, 82b, 82c and the via holes 70a, 70b, and 70c are formed. The copper seed layer 71a can be formed by a sputtering method. A copper layer 73a is formed on the copper seed layer 71a by applying the electroplating method. Thus, the interconnection grooves 82a, 82b, 82c and the via holes 70a, 70b, and 70c are filled with a metal layer 75a composed of the copper seed layer 71a and the copper layer 73a.

Figure 30:
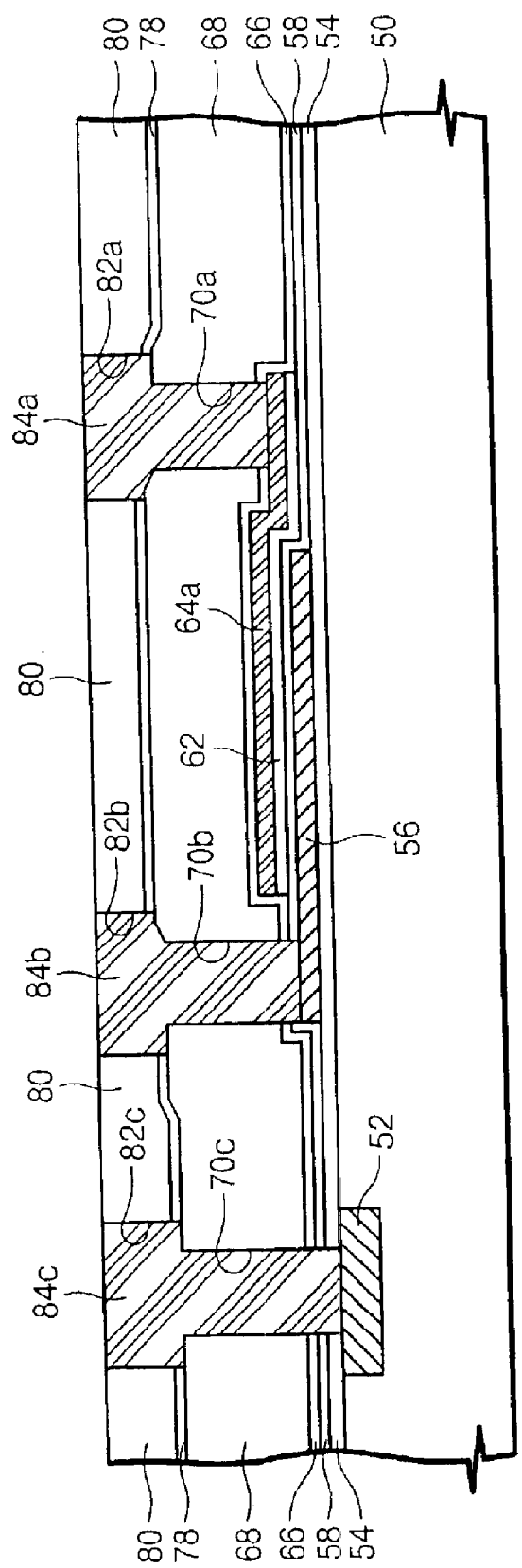

Referring to FIG. 30, the metal layer 75a is planarized using a CMP process to expose the mold layer 80 and to form a first metal interconnection 84a, a second metal interconnection 84b, and a third metal interconnection 84c. The first metal interconnection 84a is formed in the first interconnection groove 82a and in the first via hole 70a, to electrically connect with the upper plate electrode 64a. The second metal interconnection 84b is formed in the second interconnection groove 82b and in the second via hole 70b, to electrically connect with the bottom plate electrode 56. The third metal interconnection 84c is formed in the third interconnection groove 82c and in the third via hole 70c, to electrically connect with the interconnection layer 52. When the metal layer 75a is planarized by the CMP process, a top surface of the mold layer 80 can be simultaneously planarized.

A part of the first interconnection 84a, which is formed in the first via hole 70a, corresponds to an upper electrode plug 76 illustrated in FIG. 5. A part of the second interconnection 84b, which is formed in the second via hole 70b, corresponds to a bottom electrode plug 74 illustrated in FIG. 5. Also, a part of the third interconnection 84c, which is formed in the third via hole 70c, corresponds to an interconnection plug 72 illustrated in FIG. 5.

Embodiment 5.

The present embodiment is directed to another method of forming a semiconductor device having an MIM capacitor described as the second embodiment.

FIGS. 31 through 34 illustrate process cross-sectional views showing a method of forming a semiconductor device having the capacitor of the MIM structure according to the fifth embodiment of the present invention.

Referring to FIG. 31, an interconnection layer 52 is formed at a predetermined region of a semiconductor substrate 50. The interconnection layer 52 can be formed in an insulation layer which is formed on the semiconductor substrate 50. A bottom dielectric layer 54 is formed on an entire surface of the semiconductor substrate 50 having the interconnection layer 52. The bottom dielectric layer 54 is preferably formed of silicon nitride or silicon carbide. A bottom plate electrode 56 is formed on a predetermined region of the bottom dielectric layer 54. A middle dielectric layer 58 is formed at an entire surface of the semiconductor substrate 50 having the bottom plate electrode 56. An upper plate electrode 64a is formed on the middle dielectric layer 58 to be overlapped with the bottom plate electrode 56. The upper plate electrode 64a can be formed over the bottom plate electrode 56, as illustrated in FIG. 9. In this case, the upper plate electrode 64b can have a smaller area than the bottom plate electrode 56. The middle dielectric layer 58 is preferably formed of silicon nitride or silicon carbide. The bottom plate electrode 56 and the upper plate electrode 56 are formed of metal compounds. For example, the bottom plate electrode 56 and the upper plate electrode 56 are formed of a material selected from a group of comprising titanium nitride, tantalum nitride and titanium tungsten. The bottom and upper plate electrode 56 and 64a are preferably formed at a thickness of 200~1000 Å. The bottom and upper plate electrode 56 and 64a correspond to capacitor electrodes, and the middle dielectric layer 58 interposed therebetween corresponds to a capacitor dielectric layer.

An upper dielectric layer 66, an interlayer dielectric layer 68, an etch stopping layer 78 and a mold layer 80 are sequentially formed at an entire surface of a semiconductor substrate 50 having the upper plate electrode 64a. The upper dielectric layer 66 is formed of an insulation layer which has an etch selectivity with respect to the interlayer dielectric layer 68. Additionally, the upper dielectric layer 66 preferably has an etch selectivity with respect to the mold layer 80. The upper dielectric layer 66 is preferably formed of the same material as the bottom and the middle dielectric layers 54 and 58. For example, the upper dielectric layer 66 is preferably formed of silicon nitride or silicon carbide. The interlayer dielectric layer 68 can be formed of FSG or SiOC which has a low dielectric constant. The etch stopping layer 78 is formed of an insulation layer which has an etch selectivity with respect to the mold layer 80. Additionally, the etch stopping layer 78 is preferably formed of the same material with respect to the upper dielectric layer 66. For example, the etch stopping layer 78 is preferably formed of silicon nitride or silicon carbide. The mold layer 80 can be formed of FSG or SiOC.

Referring to FIG. 32, a first via hole 70a, a second via hole 70b and a third via hole 70c are formed through the interlayer dielectric layer 80 and the etch stopping layer 78 to expose predetermined regions of the upper dielectric layer 66, and a first interconnection groove 82a, a second interconnection groove 82b and a third interconnection groove 82c are formed at the mold layer 80 to cross over the first via hole 70a, the second via hole 70b and the third via hole 70c. At this time, the interconnection grooves 82a, 82b, 82c expose predetermined regions of the etch stopping layer 78. The method of forming the interconnection grooves 82a, 82b, 82c and the via holes 70a, 70b, and 70c is the same as the fourth embodiment described herein with reference to FIGS. 27A, 27B, and 28. That is, the mold layer 80, the etch stopping layer 78, and the interlayer dielectric layer 68 are successively patterned to form the via holes 70a, 70b, and 70c which expose predetermined regions of the upper dielectric layer 66. Then, the mold layer 80 is patterned using the etch stopping layer 78 as a stopper, to form interconnection grooves 82a, 82b, and 82c which cross over the via holes 70a, 70b, and 70c, respectively. Alternatively, after patterning the mold layer 80 to form interconnection grooves 82a, 82b, and 82c which expose the etch stopping layer 78, predetermined regions of the exposed etch stopping layer 78 and the interlayer dielectric layer 68 are patterned to form via holes 70a, 70b, and 70c which expose desired regions of the upper dielectric layer 66.

Figure 33:
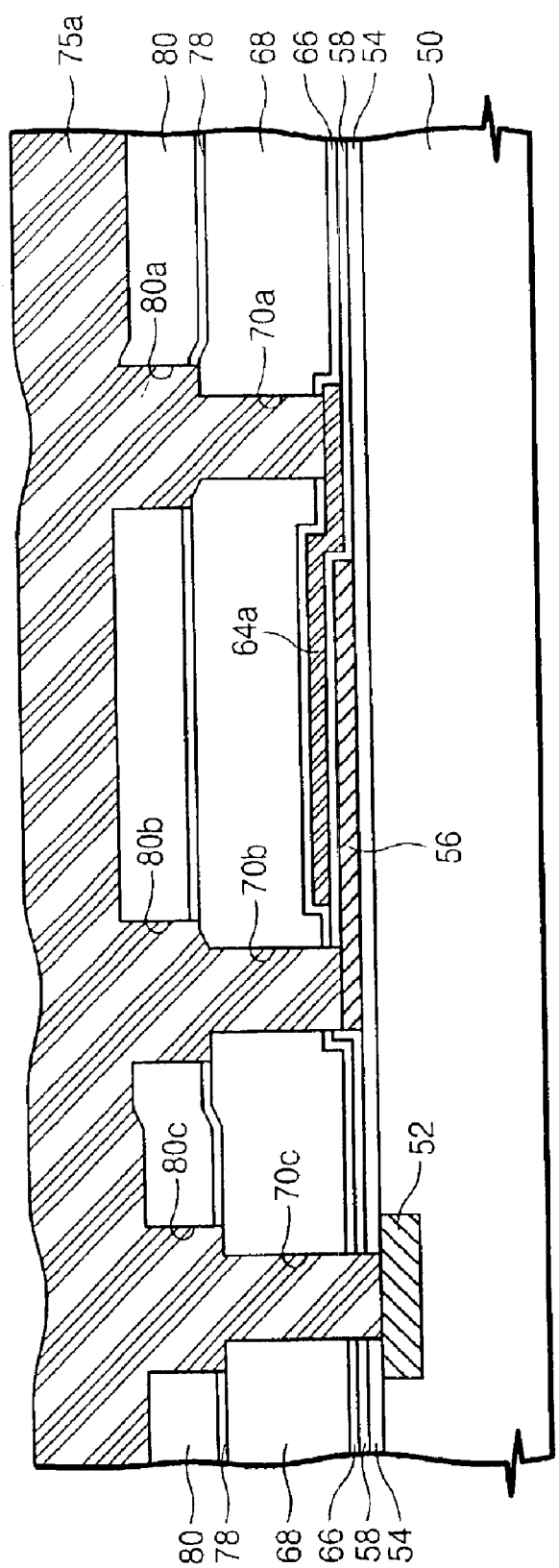
Figure 34:
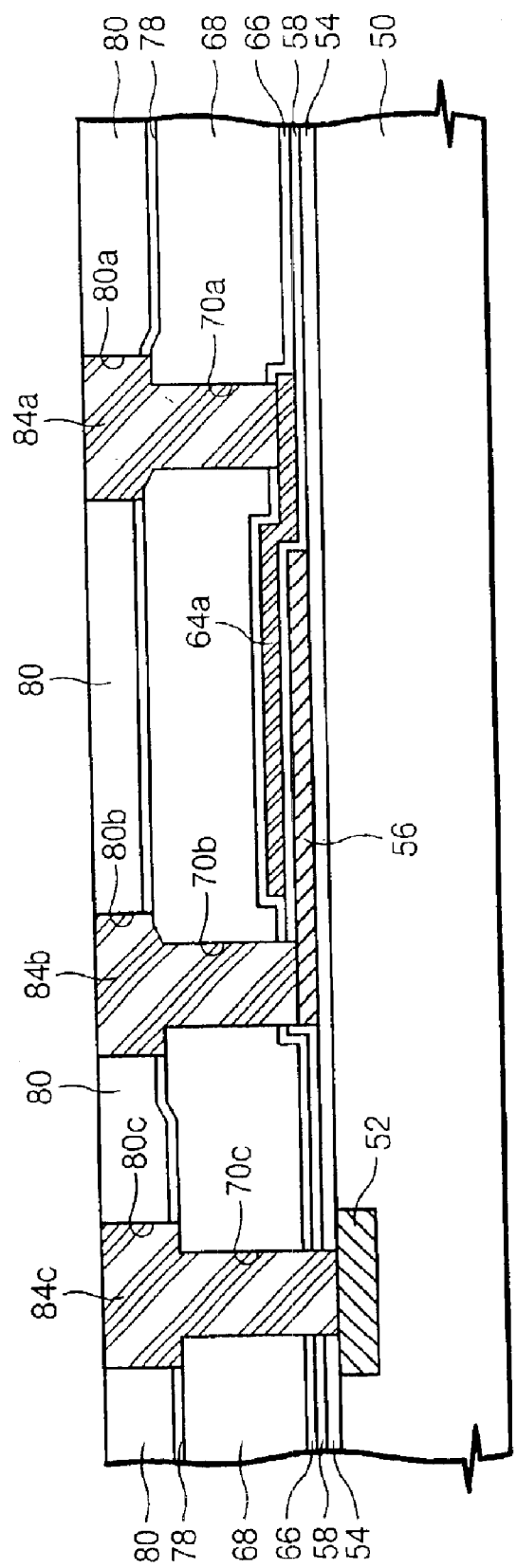

Referring to FIGS. 33 and 34, the upper dielectric layer 66 exposed by the via holes 70a, 70b, and 70c, the middle dielectric layer 58, and the bottom dielectric layer 54, are successively etched to expose predetermined regions of the upper plate electrode 64a, the bottom plate electrode 56, and the interconnection layer 52. At this time, the etch process is preferably carried out by an etch back process. Thus, the etch stopping layer 78 exposed by the interconnection grooves 82a, 82b, and 82c can be etched. The upper plate electrode 64a is exposed by etching the upper dielectric layer 66. The bottom plate electrode 56 is exposed by sequentially etching the upper and the middle dielectric layers 66 and 58. The interconnection layer 52 is exposed by sequentially etching the upper, middle and bottom dielectric layers 66, 58 and 54.

Then, a metal layer 75a is formed at an entire surface of a semiconductor substrate 50 where the upper plate electrode 64a, the bottom plate electrode 56 and the interconnection layer 52 are exposed, to fill the interconnection grooves 82a, 82b, and 82c, and the via holes 70a, 70b, and 70c. The metal layer 75a can be formed of copper or aluminum. Alternatively, before forming the metal layer 75a, a barrier metal layer (not illustrated in figures) can be conformally formed at sidewalls and bottom surfaces of the interconnection grooves 82a, 82b, and 82c, and the via holes 70a, 70b, 70c. The barrier metal layer prevents metal elements contained in the metal layer 75a from being diffused into the mold layer 80 or into the interlayer dielectric layer 68. The barrier metal layer can be formed of titanium nitride or tantalum nitride. Alternatively, the barrier metal layer can be formed of metal compounds of dense structure.

The metal layer 75a can be formed by sputtering, CVD or electroplating. In the case of using the electroplating method, the metal layer 75a can be formed by the same sequences as the fourth embodiment described herein with reference to FIG. 29. That is, after forming a copper seed layer, a copper layer can be formed on the copper seed layer using the electroplating method.

Using a CMP process, the metal layer 75a is planarized until the mold layer 80 is exposed, to form a first metal interconnection 84a in the first via hole 70a and in the first interconnection groove 82a, a second metal interconnection 84b in the second via hole 70b and in the second interconnection groove 82b, and a third metal interconnection 84c in the third via hole 70c and in the third interconnection groove 82c. The metal interconnections 84a, 84b, and 84c are electrically connected with the upper plate electrode 64a, the bottom plate electrode 56 and the interconnection layer 52, respectively. During the CMP process, a top surface of the mold layer 80 can be planarized.

A part of the first interconnection 84a, which is formed in the first via hole 70a, corresponds to an upper electrode plug 76 illustrated in FIG. 18. A part of the second interconnection 84b, which is formed in the second via hole 70b, corresponds to a bottom electrode plug 74 illustrated in FIG. 18. Also, a part of the third interconnection 84c, which is formed in the third via hole 70c, corresponds to an interconnection plug 72 illustrated in FIG. 18.

Embodiment 6.

The present embodiment is directed to another method of forming a semiconductor device having an MIM capacitor described above as the third embodiment.

FIGS. 35 through 38 illustrate process cross-sectional views of showing a method of forming a semiconductor device having the capacitor of the MIM structure according to the sixth embodiment of the present invention.

Figure 35:
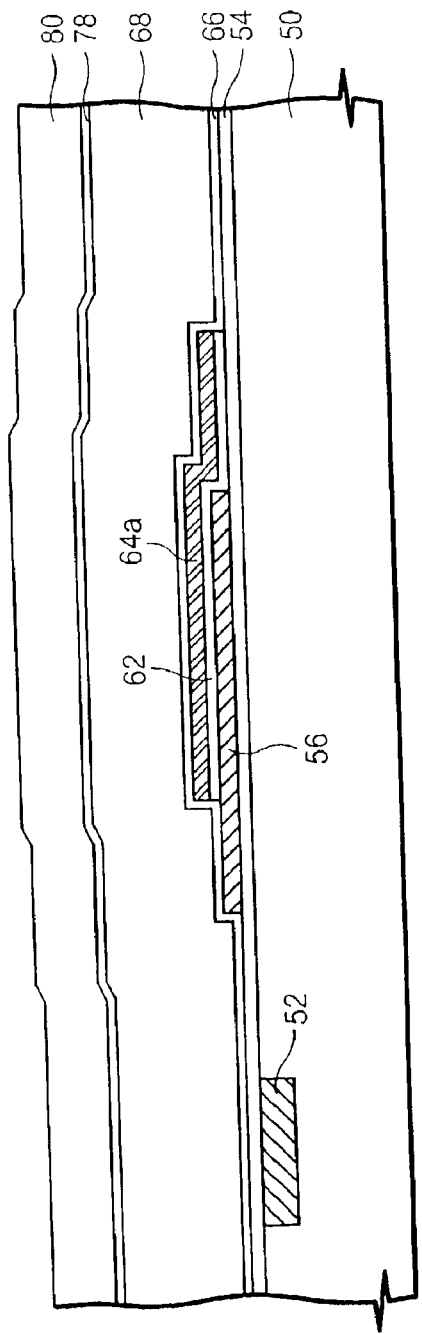
FIGS. 35 through 38 illustrate process cross-sectional views illustrating a method of forming a semiconductor device having the capacitor of the MIM structure according to the sixth embodiment of the present invention.

Referring to FIG. 35, an interconnection layer 52 is formed at a predetermined region of a semiconductor substrate 50. A bottom dielectric layer 54 is formed at an entire surface of the semiconductor substrate 50 having the interconnection layer 52. A bottom plate electrode 56 is formed on a predetermined region of the bottom dielectric layer 54. An oxide pattern 62 and an upper plate electrode 64a are sequentially formed to be overlapped with the bottom plate electrode 56. The entire surfaces of the oxide pattern 62 and the upper plate electrode 64a can be overlapped with the bottom plate electrode 56 as illustrated in FIG. 9. An oxide layer and an upper electrode layer are sequentially formed at an entire surface of the semiconductor substrate having the bottom plate electrode 56 and are successively patterned to form the oxide pattern 62 and the upper plate electrode 64a which are sequentially stacked. The bottom and upper plate electrodes 56 and 64a correspond to electrodes of a capacitor, and the oxide pattern 62 interposed therebetween corresponds to a dielectric layer of the capacitor.

An upper dielectric layer 66, an interlayer dielectric layer 68, an etch stopping layer 78 and a mold layer 80 are sequentially formed at an entire surface of a semiconductor substrate 50 having the upper plate electrode 64a.

The upper dielectric layer 66, the interlayer dielectric layer 68, the etch stopping layer 78 and the mold layer 80 can be formed of the same materials with the corresponding components which are described in the above embodiments.

Figure 36:
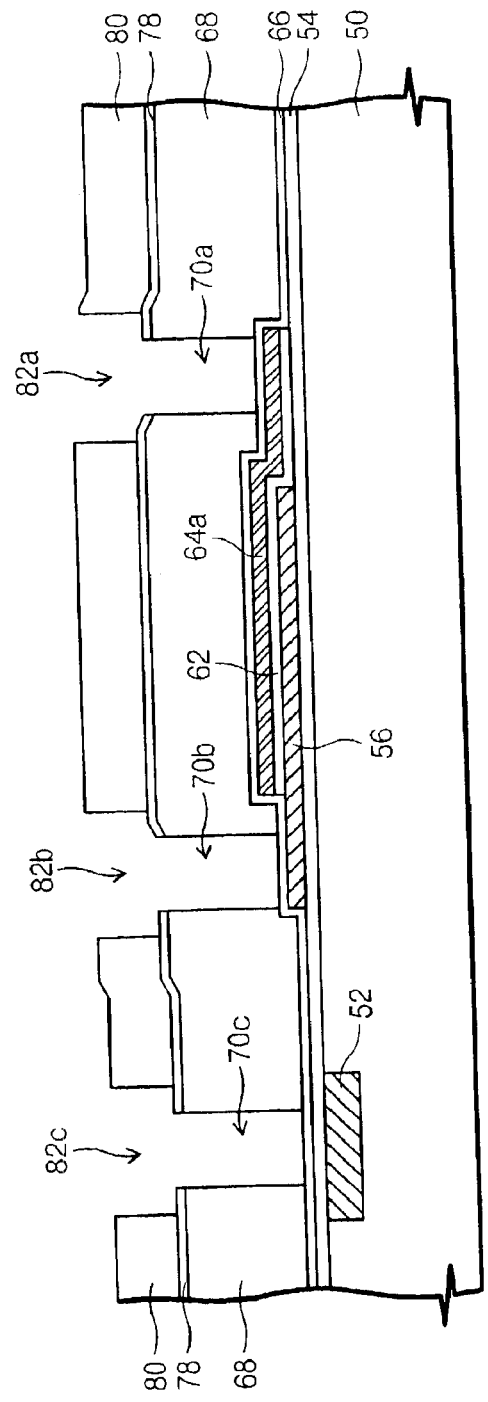

Referring to FIG. 36, a first via hole 70a, a second via hole 70b and a third via hole 70c are formed through the interlayer dielectric layer 80 and the etch stopping layer 78 to expose predetermined regions of the upper dielectric layer 66, and a first interconnection groove 82a, a second interconnection groove 82b and a third interconnection groove 82c are formed at the mold layer 80 to cross over the first via hole 70a, the second via hole 70b and the third via hole 70c. At this time, the interconnection grooves 82a, 82b, 82c expose predetermined regions of the etch stopping layer 78. The method of forming the interconnection grooves 82a, 82b, 82c and the via holes 70a, 70b, and 70c is the same as that of the fourth embodiment described with reference to FIGS. 27A, 27B, and 28. That is, the mold layer 80, the etch stopping layer 78, and the interlayer dielectric layer 68 are successively patterned to form via holes 70a, 70b, and 70c which expose predetermined regions of the upper dielectric layer 66. Then, the mold layer 80 is patterned using the etch stopping layer 78 as a stopper, to form interconnection grooves 82a, 82b, and 82c which cross over the via holes 70a, 70b, and, 70c, respectively. Alternatively, after patterning the mold layer 80 to form interconnection grooves 82a, 82b, and 82c which expose the etch stopping layer 78, predetermined regions of the exposed etch stopping layer 78 and the interlayer dielectric layer 68 are patterned to form via holes 70a, 70b, and 70c which expose desired regions of the upper dielectric layer 66, respectively.

Figure 37:
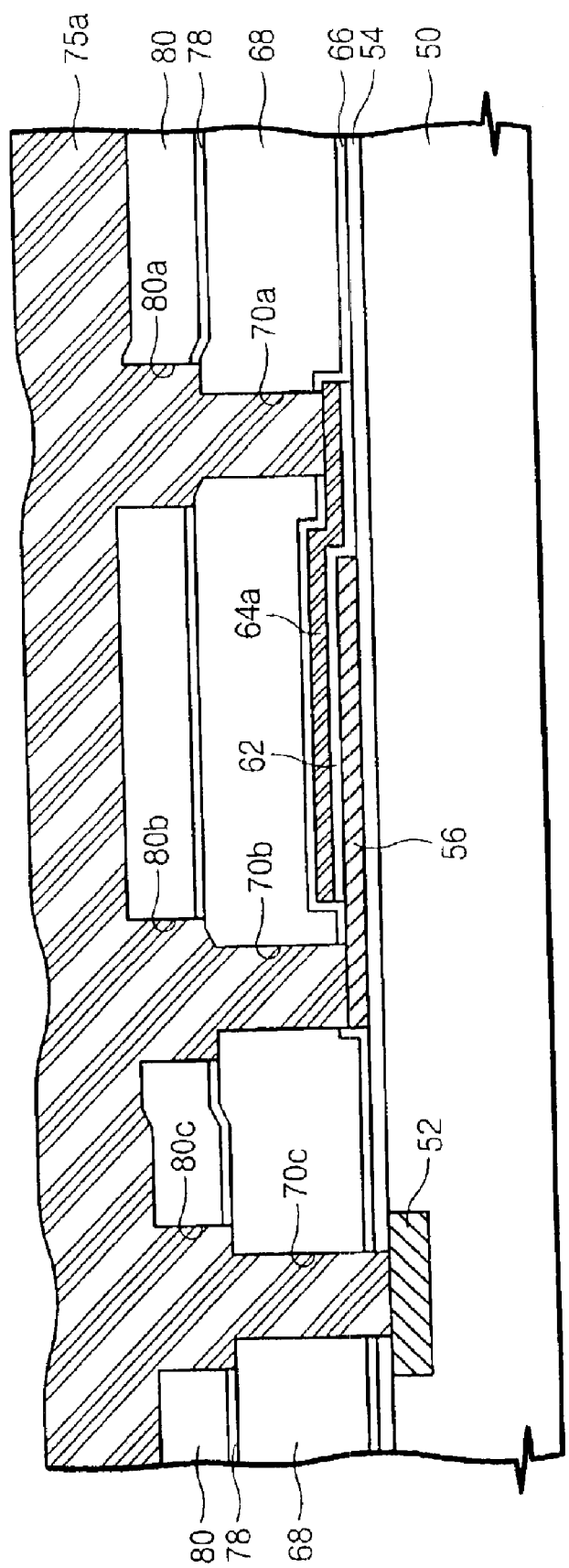
Figure 38:
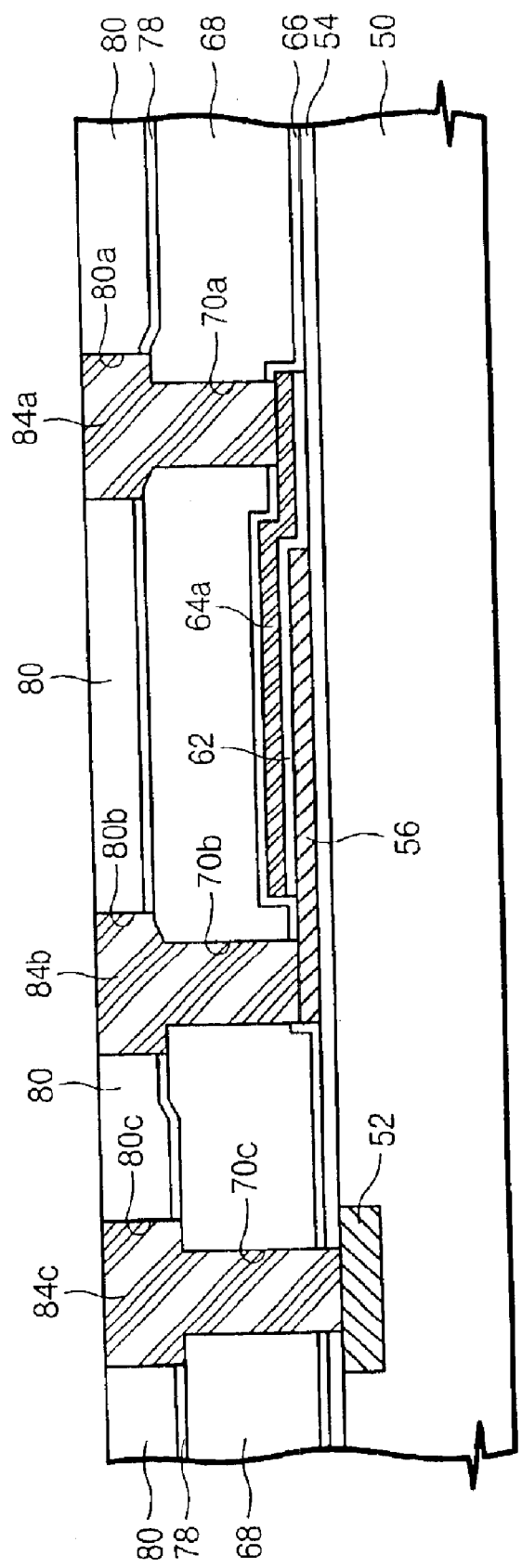

Referring to FIGS. 37 and 38, the upper dielectric layer 66 exposed by the via holes 70a, 70b, and 70c, and the bottom dielectric layer 54, are successively etched to expose predetermined regions of the upper plate electrode 64a, the bottom plate electrode 56, and the interconnection layer 52. At this time, the etch process is preferably carried out by an etch back process. Thus, the etch stopping layer 78 exposed by the interconnection grooves 82a, 82b, and 82c can be etched simultaneously. The upper plate electrode 64a and the bottom plate electrode 56 are exposed by etching the upper dielectric layer 66. The interconnection layer 52 is exposed by sequentially etching the upper and bottom dielectric layers 66 and 54.

Then, a metal layer 75a is formed at an entire surface of a semiconductor substrate 50 where the upper plate electrode 64a, the bottom plate electrode 56 and the interconnection layer 52 are exposed, to fill the interconnection grooves 82a, 82b, and 82c, and the via holes 70a, 70b, 70c. The metal layer 75a can be formed of copper or aluminum. Alternatively, before forming the metal layer 75a, a barrier metal layer (not illustrated in figures) can be conformally formed at sidewalls and bottom surfaces of the interconnection grooves 82a, 82b, and 82c, and the via holes 70a, 70b, 70c.

The metal layer 75a can be formed by sputtering, CVD or electroplating. In the case of using the electroplating method, the metal layer 75a can be formed by the same sequences with the fourth embodiment reported by referring to FIG. 29. Using a CMP process, the metal layer 75a is planarized until the mold layer 80 is exposed, to form a first metal interconnection 84a in the first via hole 70a and in the first interconnection groove 82a, a second metal interconnection 84b in the second via hole 70b and in the second interconnection groove 82b, and a third metal interconnection 84c in the third via hole 70c and in the third interconnection groove 82c. The metal interconnections 84a, 84b, and 84c are electrically connected with the upper plate electrode 64a, the bottom plate electrode 56 and the interconnection layer 52, respectively. During the CMP process, a top surface of the mold layer 80 can be planarized simultaneously.

A part of the first interconnection 84a, which is formed in the first via hole 70a, corresponds to an upper electrode plug 76 illustrated in FIG. 22. A part of the second interconnection 84b, which is formed in the second via hole 70b, corresponds to a bottom electrode plug 74 illustrated in FIG. 22. Also, a part of the third interconnection 84c, which is formed in the third via hole 70c, corresponds to an interconnection plug 72 illustrated in FIG. 22.

The corresponding components can be formed of the same materials in the method of forming the semiconductor device according to the first through the sixth embodiments of the present invention.

According to the present invention, in a semiconductor device having high speed and superior frequency performance, capacitor electrodes of the MIM structure are formed in a flat structure to improve the uniformity of a capacitor dielectric layer and reduce parasitic capacitance. Also, in a semiconductor device having a copper interconnect, an upper electrode and a bottom electrode of a capacitor are formed not of copper, but of a metal compound such as titanium nitride, tantalum nitride and titanium tungsten, to prevent degradation of dielectric layer characteristics due to diffusion of copper. Moreover, an oxide can be used as a capacitor dielectric layer to fabricate a semiconductor device having a superior frequency performance.

A capacitor dielectric layer and an upper electrode material can be sequentially formed without any time interval, to form a capacitor dielectric layer of superior characteristics without any process damaging a capacitor dielectric layer even though an interconnect structure and a capacitor are simultaneously formed.

Additionally, conductive plugs connecting a bottom interconnection layer, a bottom plate electrode and an upper plate electrode to a metal interconnection can be formed simultaneously to decrease process time.

What is claimed is:

1. A semiconductor device comprising:
    a bottom plate electrode disposed on a predetermined region of a semiconductor substrate;
    an upper plate electrode overlapped with the bottom plate electrode such that a first portion of the bottom plate electrode protrudes laterally from under the upper plate electrode;
    a capacitor dielectric layer interposed between the bottom plate electrode and the upper plate electrode, the capacitor dielectric layer comprising a middle dielectric layer interposed between the bottom plate electrode and the upper plate electrode;

an interlayer dielectric layer formed on the upper plate electrode and the bottom plate electrode; and an upper dielectric layer conformally interposed between the upper plate electrode and the dielectric layer;

a bottom electrode plug and an upper electrode plug which are connected to the bottom plate electrode and the upper plate electrode, respectively, through the interlayer dielectric layer, the bottom electrode plug also penetrating the middle dielectric layer to contact the first portion of the bottom plate electrode protruding laterally from under the upper plate electrode, and the upper electrode plug also penetrating the upper dielectric layer to contact the upper plate electrode, wherein the upper plate electrode and the bottom plate electrode are formed of a metal compound.

2. The semiconductor device as claimed in claim 1, wherein the upper plate electrode and the bottom plate electrode are formed of a material selected from a group consisting of titanium nitride (TiN), tantalum nitride (TaN) and titanium tungsten (TiW).

3. The semiconductor device as claimed in claim 1, further comprising a bottom dielectric layer formed on the semiconductor substrate, wherein the bottom plate electrode is disposed on the bottom dielectric layer.

4. The semiconductor device as claimed in claim 1, wherein the middle dielectric layer is formed of at least one of silicon nitride and silicon carbide.

5. The semiconductor device as claimed in claim 1, wherein the capacitor dielectric layer further comprises an oxide pattern interposed between the middle dielectric layer and the upper plate electrode.

6. The semiconductor device as claimed in claim 1, wherein the upper dielectric layer is a dielectric layer having an etch selectivity with respect to the interlayer dielectric layer.

7. The semiconductor device as claimed in claim 1, wherein the middle dielectric layer and the upper dielectric layer are formed of the same material.

8. The semiconductor device as claimed in claim 1, wherein the upper electrode plug and the bottom electrode plug are formed of at least one of copper and aluminum.

9. The semiconductor device as claimed in claim 1, wherein the interlayer dielectric layer is formed of at least one of fluorinated silicate glass (FSG) and silicon oxicarbide (SiOC).

10. The semiconductor device as claimed in claim 1, further comprising:

an etch stopping layer and a mold layer sequentially formed on the interlayer dielectric layer; and metal interconnections connected to the upper electrode plug and the bottom electrode plug by sequentially penetrating the mold layer and the etch stopping layer.

11. The semiconductor device as claimed in claim 10, wherein the mold layer is formed of at least one of FSG and SiOC.

12. The semiconductor device as claimed in claim 1, wherein the upper electrode plug is formed over the bottom plate electrode to be connected to the upper plate electrode.

13. The semiconductor device as claimed in claim 1, further comprising a barrier metal layer interposed between the upper electrode plug and the interlayer dielectric layer and between the bottom electrode plug and the interlayer dielectric layer.

14. A semiconductor device comprising:

an interconnection layer disposed at a predetermined region of a semiconductor substrate;

a bottom dielectric layer covering an entire surface of the semiconductor substrate and the interconnection layer;

a bottom plate electrode disposed on the bottom dielectric layer;

an upper plate electrode overlapped with the bottom plate electrode;

a capacitor dielectric layer interposed between the bottom plate electrode and the upper plate electrode;

an upper dielectric layer conformally formed on the bottom plate electrode, the upper plate electrode and the bottom dielectric layer on the interconnection layer;

an interlayer dielectric layer formed on the upper dielectric layer;

an interconnection plug connected to the interconnection layer by sequentially penetrating the interlayer dielectric layer, the upper dielectric layer and the bottom dielectric layer;

a bottom electrode plug connected to the bottom plate electrode by sequentially penetrating the interlayer dielectric layer, the upper dielectric layer; and an upper electrode plug connected to the upper plate electrode by sequentially penetrating the interlayer dielectric layer and the upper dielectric layer, wherein the upper plate electrode and the bottom plate electrode are formed of a metal compound.

15. The semiconductor device as claimed in claim 14, wherein the upper plate electrode and the bottom plate electrode are formed of a material selected from a group consisting of titanium nitride (TiN), tantalum nitride (TaN), and titanium tungsten (TiW).

16. The semiconductor device as claimed in claim 14, wherein the upper electrode plug, the bottom electrode plug and the interconnection plug are formed of at least one of copper and aluminum.

17. The semiconductor device as claimed in claim 14, wherein the capacitor dielectric layer further comprises a middle dielectric layer interposed between the bottom plate electrode and the upper dielectric layer, the bottom electrode plug sequentially penetrating the upper dielectric layer and the middle dielectric layer.

18. The semiconductor device as claimed in 17, wherein the middle dielectric layer is extended to be interposed between the bottom dielectric layer and the upper dielectric layer, and the interconnection plug sequentially penetrates the upper dielectric layer, the middle dielectric layer and the bottom dielectric layer.

19. The semiconductor device as claimed in claim 17, wherein the capacitor dielectric layer further comprises an oxide pattern interposed between the middle dielectric layer and the upper plate electrode.

20. The semiconductor device as claimed in claim 16, further comprising:

an etch stopping layer and a mold layer sequentially formed on the interlayer dielectric layer; and metal interconnections which are connected to the interconnection plug, the upper electrode plug and the bottom electrode plug by sequentially penetrating the mold layer and the etch stopping layer.

21. The semiconductor device as claimed in claim 16, wherein a portion of the upper plate electrode is formed on the bottom dielectric layer, and the upper electrode plug is connected to the upper plate electrode on the bottom dielectric layer.

22. The semiconductor device as claimed in claim 16, wherein the upper electrode plug is formed over the bottom plate electrode to be connected to the upper plate electrode.

23. The semiconductor device as claimed in claim 16, further comprising a barrier metal layer interposed between the interlayer dielectric layer and each of the interconnection plug, the upper electrode plug and the bottom electrode plug.

* * * * *

UNITED STATES PATENT AND TRADEMARK OFFICE
CERTIFICATE OF CORRECTION

PATENT NO. : 6,881,999 B2
DATED : April 19, 2005
INVENTOR(S) : Ki-Young Lee et al.

It is certified that error appears in the above-identified patent and that said Letters Patent is hereby corrected as shown below:

Column 20,
Lines 46, 54, 59 and 62, please delete "16" and insert -- 14 --.

Signed and Sealed this

Twenty-fifth Day of October, 2005

JON W. DUDAS
*Director of the United States Patent and Trademark Office*